(12) United States Patent
Li et al.

(10) Patent No.: US 11,280,675 B2
(45) Date of Patent: Mar. 22, 2022

(54) METHOD, SYSTEM AND APPARATUS FOR A RAMAN SPECTROSCOPIC MEASUREMENT SYSTEM

(71) Applicants: Ruolin Li, Milpitas, CA (US); Yanan Ma, Milpitas, CA (US)

(72) Inventors: Ruolin Li, Milpitas, CA (US); Yanan Ma, Milpitas, CA (US)

( * ) Notice: Subject to any disclaimer, the term of this patent is extended or adjusted under 35 U.S.C. 154(b) by 31 days.

(21) Appl. No.: 16/902,138

(22) Filed: Jun. 15, 2020

(65) Prior Publication Data
US 2020/0400492 A1 Dec. 24, 2020

Related U.S. Application Data

(60) Provisional application No. 62/862,787, filed on Jun. 18, 2019.

(51) Int. Cl.
| | | |
|---|---|---|
| *G01J 3/02* | (2006.01) | |
| *G01J 3/28* | (2006.01) | |
| *H01S 5/14* | (2006.01) | |
| *G01J 3/44* | (2006.01) | |
| *G01J 3/18* | (2006.01) | |

(52) U.S. Cl.
CPC ........... *G01J 3/0218* (2013.01); *G01J 3/0294* (2013.01); *G01J 3/1895* (2013.01); *G01J 3/2803* (2013.01); *G01J 3/4412* (2013.01); *H01S 5/14* (2013.01)

(58) Field of Classification Search
CPC ...... G01J 3/0218; G01J 3/2803; G01J 3/4412; G01J 3/0294; G01J 3/1895; G01J 2003/065; G01J 3/06; G01J 3/0256; G01J 3/10; G01J 3/32; G01J 3/36; G01J 3/44; H01S 5/14
See application file for complete search history.

(56) References Cited

U.S. PATENT DOCUMENTS

| | | | |
|---|---|---|---|
| 5,373,358 A | * 12/1994 | Adachi | ..................... G01J 3/44 |
| | | | 356/301 |
| 5,638,173 A | * 6/1997 | Smith | ..................... G01J 3/44 |
| | | | 356/301 |
| 7,361,501 B2 | 4/2008 | Koo et al. | |
| 9,194,804 B2 | 11/2015 | Yao et al. | |

(Continued)

FOREIGN PATENT DOCUMENTS

EP  2913663 A1  9/2015

*Primary Examiner* — Abdullahi Nur
(74) *Attorney, Agent, or Firm* — Ruolin Li; Yanan Ma

(57) ABSTRACT

A chip-based planar Raman spectroscopic measurement system is disclosed comprising at least a semiconductor laser as excitation light source, an output waveguide coupling and delivering laser light out of chip, a photo-detector monitoring the laser optical power, an input waveguide coupling signal light to chip, a planar spectrometer comprising Planar Waveguide Grating (PWG) and an array photo-detectors, and control electronics. In some embodiments the PWG is a fixed frequency Arrayed Waveguide Grating (AWG), the laser is frequency-tunable. In other embodiments, the laser has fixed frequency, the PWG or the AWG is frequency tunable. In either case, the frequency tunability will ensure the recapture of the spectral information missed due to the spectral characteristics of the planar waveguide grating such as the channel spacing of the AWG, resulting in high channel count and high-resolution Raman measurement of sufficient spectral range.

22 Claims, 18 Drawing Sheets

(56) References Cited

U.S. PATENT DOCUMENTS

| | | |
|---|---|---|
| 9,581,493 B2 | 2/2017 | Cooper et al. |
| 9,879,299 B2 | 1/2018 | Tamakawa et al. |
| 2007/0057211 A1 | 3/2007 | Bahlman et al. |
| 2009/0046288 A1 | 2/2009 | Grafts et al. |
| 2010/0245816 A1 | 9/2010 | Shen et al. |
| 2015/0226607 A1 | 8/2015 | Cooper et al. |
| 2016/0202119 A1 | 7/2016 | Lee |
| 2018/0228411 A1 | 8/2018 | Yang et al. |

\* cited by examiner

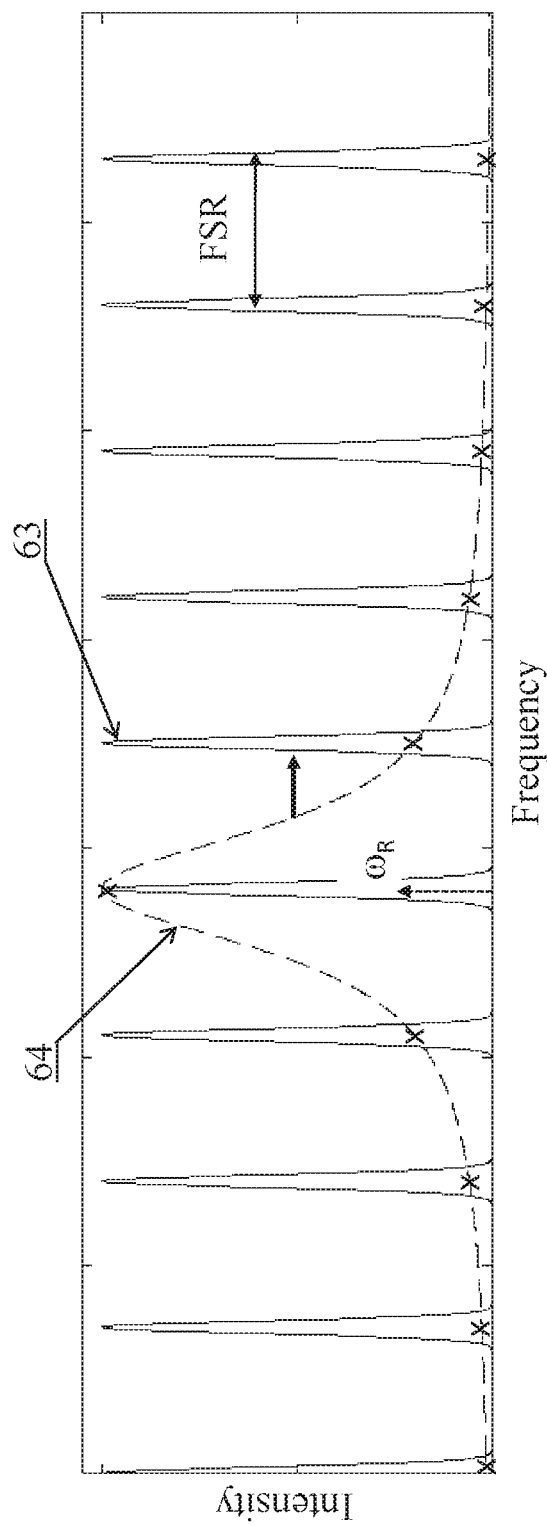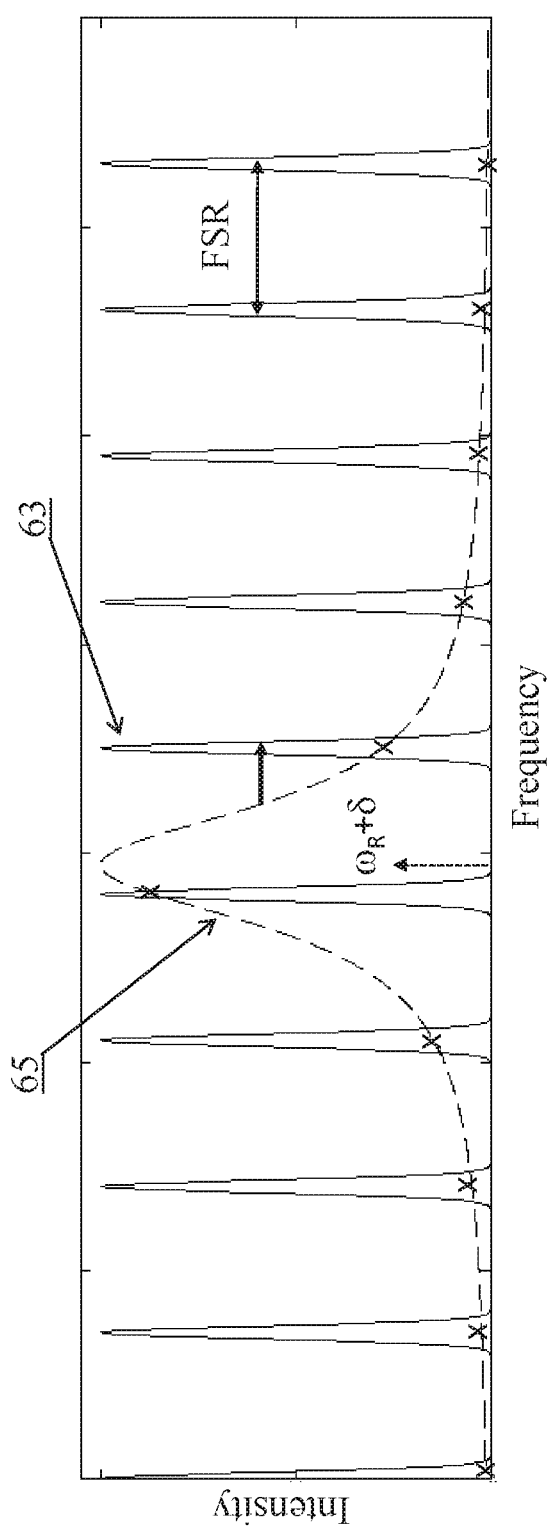

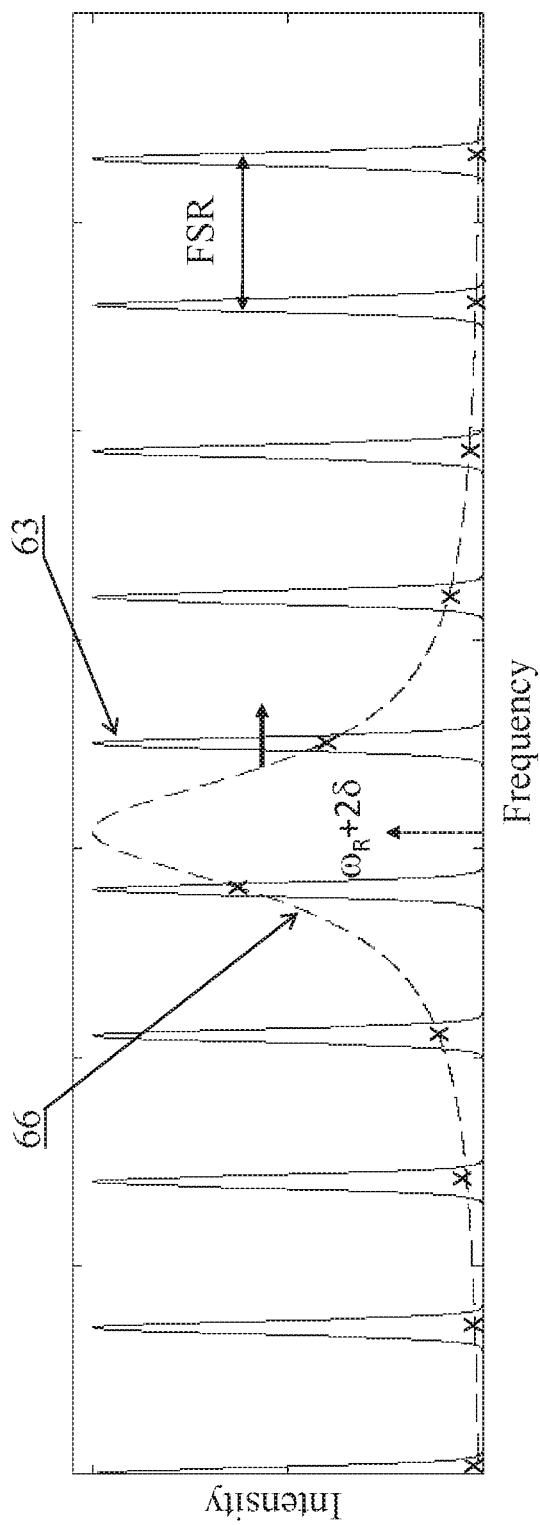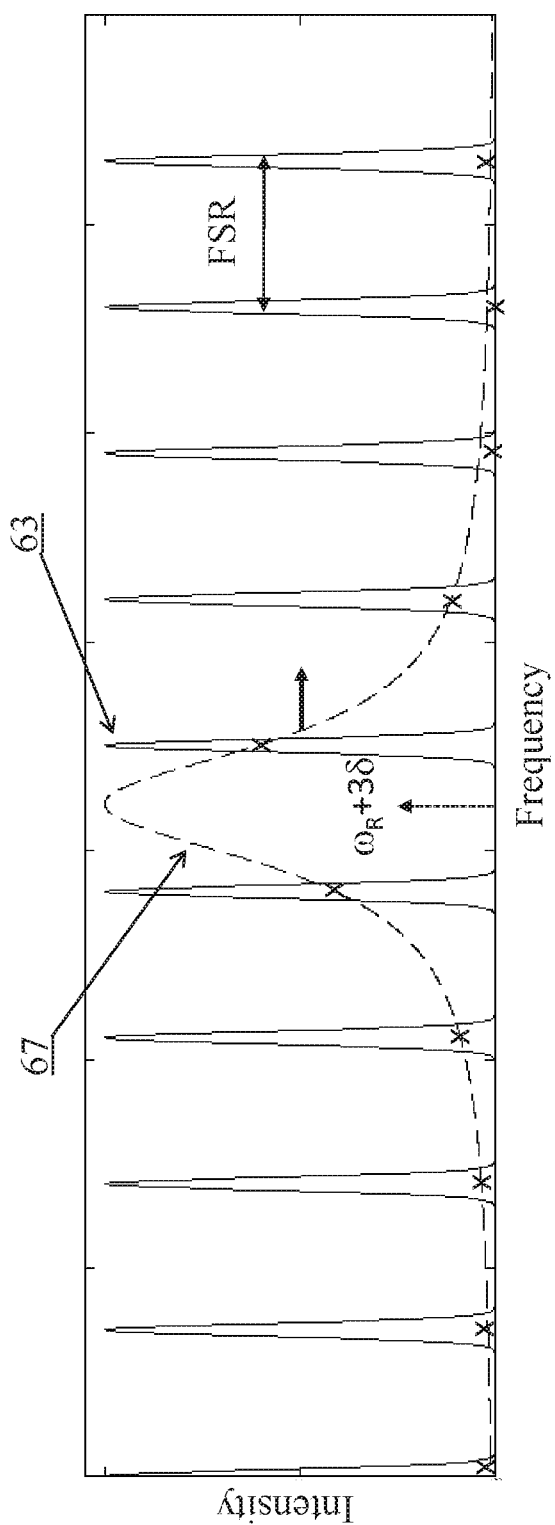
FIG. 7C
FIG. 7D

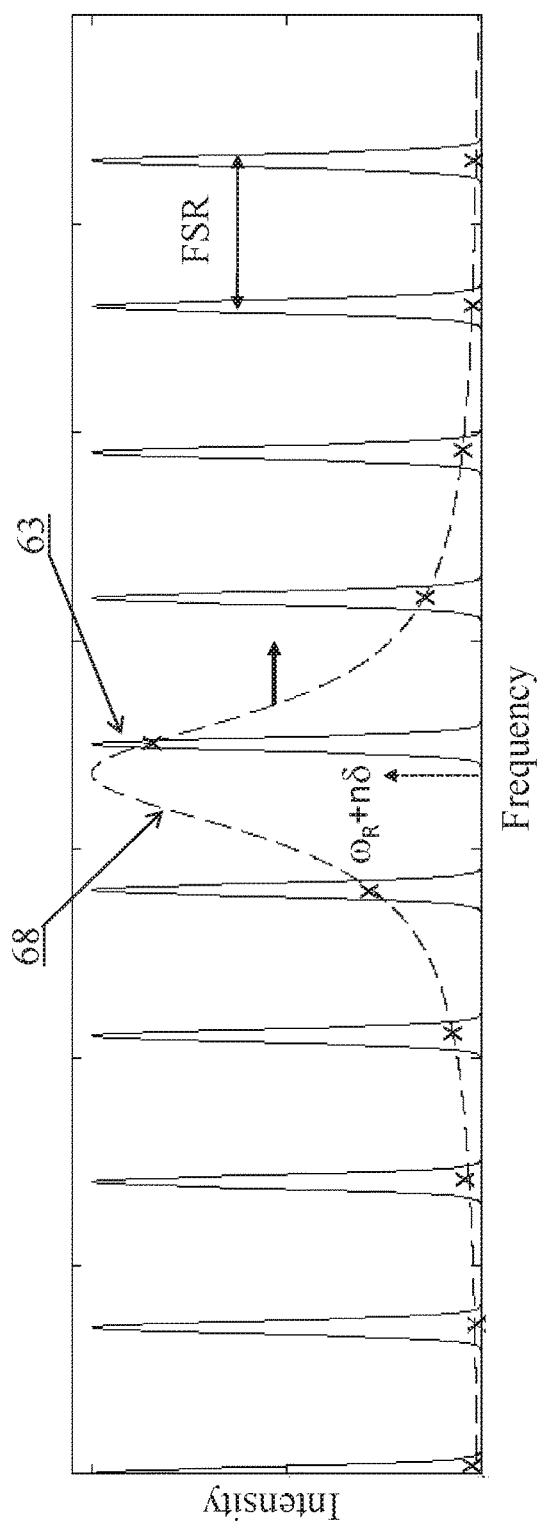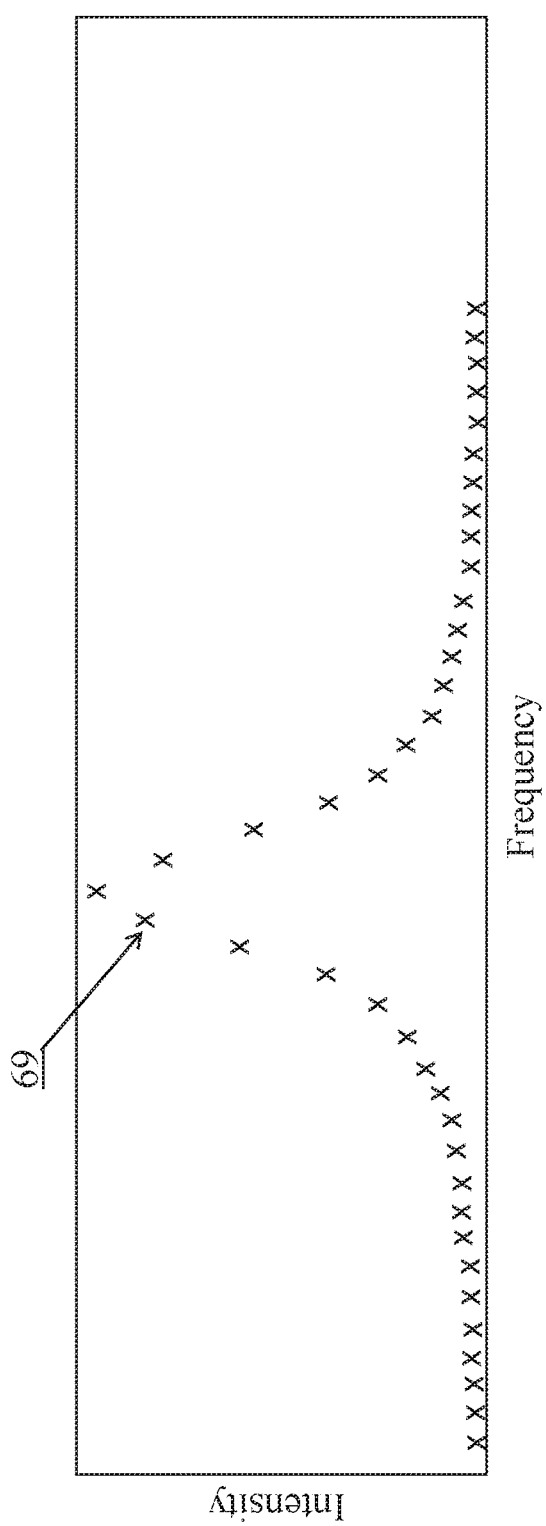
FIG. 7E
FIG. 7F

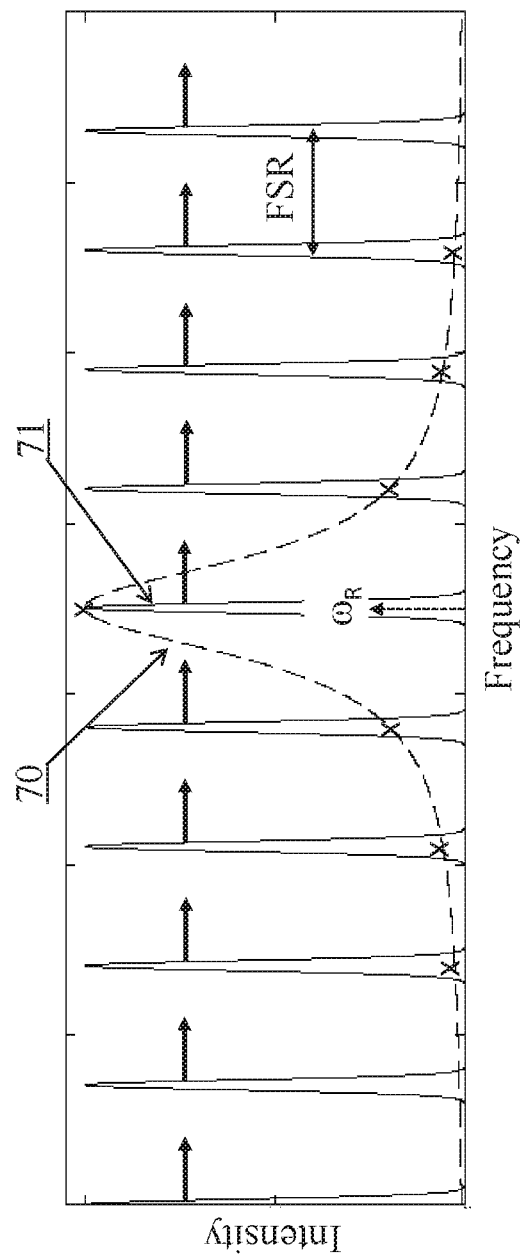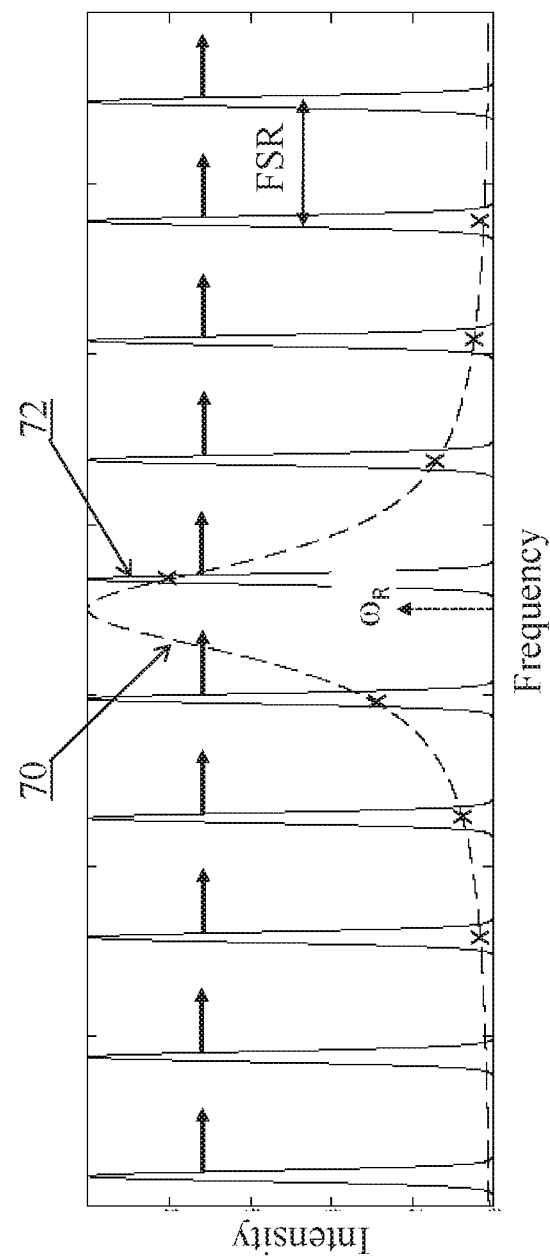
FIG. 8A
FIG. 8B

METHOD, SYSTEM AND APPARATUS FOR A RAMAN SPECTROSCOPIC MEASUREMENT SYSTEM

CROSS-REFERENCE TO RELATED APPLICATIONS

The present application claims the benefit of U.S. Provisional Application No. 62/862,787, filed on Jun. 18, 2019, which is incorporated herein by reference in its entirety for all purposes.

FIELD

The field of the present invention relates generally to optical measurement systems, more particularly, it relates to Raman scattering spectroscopy analysis systems.

BACKGROUND

Raman scattering spectroscopy is an optical-based method of analysis of the composition of substances with unique advantages over other analytical instruments and techniques. It is a non-invasive method of obtaining the molecular fingerprint spectrum of many substances, requiring almost no sample preparation. As the Raman method is label-free, nondestructive with sub-micron spatial resolution, and easy to use, it is becoming a popular means of analysis in manufacture, bio-medical, semiconductor, R&D, pharmaceutical, drug screening, and security inspection.

A Raman analyzing system usually consists of an excitation light source or a laser, laser beam delivery optics, signal light collecting optics, a spectrometer with a detector array, and control electronics and software for spectral registration and analysis. The systems are usually bulky and costly, especially when high resolution and wide spectral range are needed. Today's most commercially available, highly accurate Raman spectrometers are desktop-sized and expensive. Portable Raman analyzers available for uses in a "point-and-shoot" method suffer from performance limitations and are also costly. Despite the fact that Raman spectroscopy has so many advantages, it still is mostly limited to lab test or professional analysis.

As shown in Prior Art FIG. 1A, a free-space optical Raman measurement system includes a laser, optical elements to deliver the laser beam to sample, optics to capture and couple the scattered light, a spectrometer consisting of dispersive optical element (typically a grating) for light or photon dispersion, a multi-channel photo-detector (PD) array for light measurement, and electronics for control and spectral data acquisition. As the optical spectral resolution is proportional to the distance traveled by the light to the photo-detectors after the grating diffraction, a wide spectral range or high spectral resolution requirement usually leads to a large size of the spectrometer. For hand-held device, mobile, or in-cell phone Raman application where space is tightly constrained, the size of the Raman analyzer needs to be greatly reduced.

With the demand and trend that Raman is getting into consumer application such as food safety, a small footprint and lower cost solution is required. Further this solution requires adequate performance in terms of resolution, wide spectral range, and high sensitivity. Therefore, high performance, small size, and low-cost Raman systems are the key to increasing and enabling greater acceptance and wider usage of Raman spectroscopy. As the traditional Raman spectrometers including both desktop and handheld versions are based on free-space optical technology with discrete components, reducing size and cost to meet application demand such as Raman analysis in cell phone or mobile device is extremely challenging, a new solution is awaited.

BRIEF DESCRIPTION OF DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures:

FIG. 7A-7E are the diagrams illustrating the step by step measurements of a Raman scattering curve with a fixed frequency AWG and a tunable laser consistent with embodiments of the invention;

FIG. 7F is a diagram plotting the measurement results of FIG. 7A to 7E together taking into account the laser tuning consistent with embodiments of the invention;

FIG. 8A-8D are the diagrams illustrating the step by step measurement of a Raman scattering curve with frequency tunable AWG and a fixed frequency laser consistent with embodiments of the invention;

DETAILED DESCRIPTION

Figure 1A:
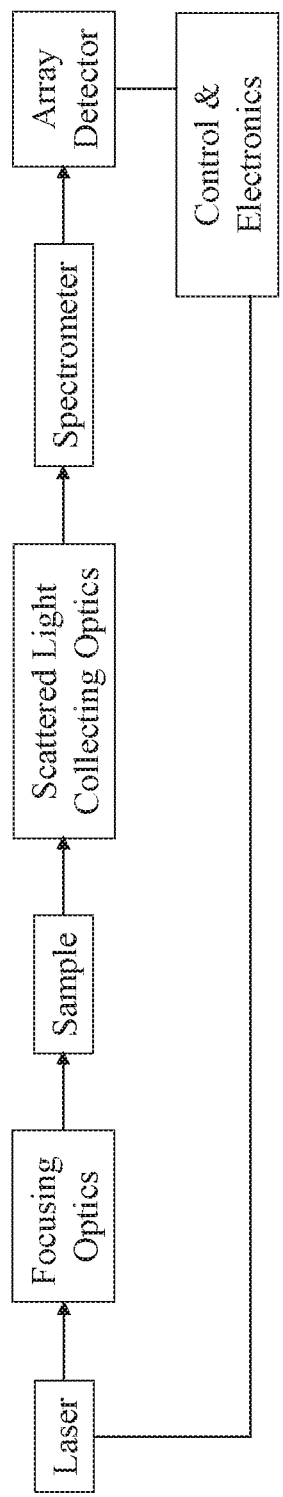
FIG. 1A is a prior art schematic depicting a typical free-space Raman measurement system.

Certain features of the present invention may be implemented in software, hardware, firmware, or combinations thereof. The computer programs described herein are not limited to any embodiment. The computer programs for control and analysis may be executed on a single computer or server processor or multiple computer or server processors.

Throughout the following description specific details are set forth in order to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive or exclusive, sense.

In a typical Raman scattering process, photons from the excitation light source or a laser interact with a molecular vibration or an elementary excitation in a solid through an energy exchange process. For Stokes-Raman scattering process on which most Raman spectroscopic measurements are conducted, for example, the frequency $\omega_R$ of the Raman scattered photons is given by $$\omega_R = \omega_L - \gamma_R \quad (1)$$

where $\omega_L$ is the frequency of the photons of the excitation light source or the laser; $\gamma_R$ is the frequency of the Raman active vibration of molecule or so-called Raman shift, and $\omega_R$ is frequency of the Raman scattered photons. The Raman vibration frequency $\gamma_R$ is typically in the infrared spectral region, intrinsic to the molecule, and independent of the frequency of laser or the excitation photons. The intensity distribution curve of a Raman scattering normally exhibits a Lorentz or Gaussian spectral profile around the center Raman scattering frequency $\omega_R$ in spectra.

Equation (1) shows that for a given Raman-active molecular vibration, its Stokes-Raman scattering photons may appear at different absolute frequency dependent of the frequency of the laser used in the Raman measurement. The same also holds true for ant-Stokes Raman scatter process.

In recent years, Raman microscopy has attracted great attention as suitable technique for characterization of different solids and composites. By using Raman microscopy, it is possible to obtain various information such as chemical composition of sample, its morphological properties, distribution of specific compounds, structure of materials, mechanical properties of sample, etc.

The embodiments of the invention apply to both Stokes and anti-Stokes light scattering process.

Provided embodiments disclose a chip-based system and method for providing Raman spectroscopic measurement with high resolution, high channel count, compact integration, small foot-print, and low cost, all of which are desired for hand-held device, mobile, and even in-cell-phone Raman analysis application.

Some provided embodiments disclose methods of material characterization. An exemplary embodiment illuminates a sample of material with laser light at a first frequency (i.e., wavelength, same below). It then receives light at that frequency which was scattered by the material. This light is then demultiplexed in frequency into several different frequency channels where the intensity of light in each channel is measured. The sample is then illuminated by a laser at a second frequency and scattered light is received at the second frequency. This light is additionally demultiplexed in frequency into a number of different frequency channels and the intensity of light measured in each channel. The intensity data from the first and second measurement are used to characterize the material.

In accordance with aspects of the invention, a system is disclosed as a chip-based planar Raman spectroscopic measurement system comprising at least a semiconductor laser as excitation light source. An output waveguide and beam focusing optics are used to couple the laser light and to deliver it out of chip. A photo-detector is used to monitor the laser optical power. Collecting optics and an input waveguide couple in the signal or scattered light to chip. Waveguides are used for routing the light to an optical demultiplexer such as a Planar Waveguide Grating (PWG). The PWG is attached to an array of output waveguides for light routing after the dispersion of the received light. These waveguides are attached to an array of photo-detectors which measure the intensity of received light at each frequency. In some embodiments, the laser has a tunable frequency and the frequency of the PWG is fixed. In other embodiments, the frequency of the laser is fixed and the frequency of the PWG is tunable. In this manner spectral information missed due to the spectral characteristics of the PWG will be re-captured in a subsequent optical illuminating from the laser. This capability is possible based on a provided method utilizing the frequency-tuning for high channel count and high-resolution Raman measurement. In these embodiments, the laser can be a semiconductor laser such as DFB, DBR, or external cavity laser built on the chip with III-V gain chip as photon source and an external waveguide grating that provides feedback In some embodiments, the PWG can be an Arrayed Waveguide Grating (AWG), an Echelle waveguide grating, serial transmission waveguide gratings, serial reflection waveguide gratings, or some kind of optical demultiplexer including reflection waveguide grating, transmission waveguide grating, interleaved waveguide Mach-Zehnder-Interferometer (MZI), or multi-waveguide Ring-Resonators, all of which can be implemented on a Planar Light Circuit (PLC) chip. In some embodiments external electronics can be used for control and processing of the spectral data that can be further integrated on same chip.

Some further embodiments use external optics to couple the laser light out of the chip and focus it on the sample. Additional optics may be used to capture and couple the Raman scattered photons to the chip for various spectral measurements and processing.

In some provided embodiments, the laser or the PWG is frequency tunable. In provided embodiments, the input waveguide, the PWG, the output waveguide array, array of photo-detectors, and routing waveguides connecting them are the basic components of a planar spectrometer on a chip provided by embodiments of this invention.

In certain embodiment the laser is frequency (i.e., wavelength, same below) tunable and the optical demultiplexer, or the PWG, is a fixed frequency Arrayed Waveguide Grating (AWG). The AWG works as a transmission grating in the planar spectrometer. The transmission spectrum of AWG is characterized by a comb of peaks of equal frequency separation, also called channel spacing or Free-Spectral-Range (FSR), with each peak representing a frequency detection channel. The AWG or AWG-based planar spectrometer offers high resolution per frequency channel, however, with a draw-back that spectral information falling in the channel spacing is missing. Therefore, Raman measurements with such AWG-based spectrometer and a laser operating at a fixed frequency will result in less informative spectra.

According to the Raman scattering theory, the absolute frequency of Raman photons scattered by a molecular vibration is dependent of both the frequency of the laser being used and the frequency of the molecular vibration that is constant and intrinsic to the molecule. In provided embodiments the laser is frequency tunable with an adequate tuning range around a center frequency, and tuned in frequency step by step to ensure that the aggregate bandwidth of the frequency channels of the Raman measurement covers the full spectral range of the channel spacing of the AWG. This allows Raman scattering to be measured correspondingly at each tuning step with the AWG-based planar spectrometer. In these embodiments, the laser's frequency tunability allows accurate measurement of the Raman scattering curve scanned against the fixed detection channels of the planar spectrometer. Spectral information missing due to the limited bandwidth of the channels and the channel spacing or FSR is recaptured in step in a time multiplexing manner by subsequent scans at a different laser frequency. This iterative process results in a high detection channel count and high resolution Raman measurement of the system by taking into account the laser tuning effect. Provided embodiments realize these advantages as a fine spectral line-width of sub-GHz or even sub-MHz, which is less than the channel spectral resolution of a typical AWG, and a wide tuning range of a few nm or even 10+ nm are both commonly available with today's tunable semiconductor laser technology.

An additional advantage of provided embodiments is that by switching the lasers to different frequencies these embodiments can also help eliminating the impact of fluorescence in the Raman scattering measurement, it is a straightforward advantage in this invention as with the tunable laser more frequencies are available and there is no need of additional laser source to get rid of fluorescence.

In certain embodiments, the laser operates at a fixed frequency, however, the optical demultiplexer or PWG is an AWG that is tunable in frequency with an adequate tuning range. In this embodiment, the Raman scattering curve under measurement stays at fixed absolute frequency, the comb of detection channels of the AWG is tuned together in frequency to scan over the Raman scattering curve step by step to cover a full spectral range of the channel spacing of the AWG. The spectral information within the channel spacing as in the case without any tuning is captured similarly as described above, and an effectively high channel count detection and high resolution Raman measurement of the system is achieved.

In certain embodiments, one laser and more AWG-based planar spectrometers of different spectral region can be integrated on chip to expand the spectral range and region in the Raman measurement of the system, where the laser is frequency tunable or some or all AWGs are frequency tunable.

In certain embodiments, additional lasers of different center frequency and one AWG-based spectrometer can be integrated on chip to expand the spectral range and region in the Raman measurement of the system. In these embodiments either the lasers are frequency tunable and the spectrum of the AWG is fixed, or the lasers are fixed frequency and the AWG is frequency-tunable. In other provided embodiments, the frequency of the lasers and the spectrum of the AWG are both tunable.

In certain embodiment, additional lasers of different center frequency and more AWG-based spectrometers of different spectral region can be incorporated to expand the spectral range and region in the Raman measurement of the system. Like the previously described embodiments, the lasers may be fixed or frequency tunable and/or the AWG is fixed or frequency-tunable.

In certain embodiments, the lasers and AWG-based planer spectrometers can be incorporated as separated or discrete interchangeable pieces in the Raman measurement for flexibility and more spectral region and range, where either the lasers or the AWGs are either fixed or frequency-tunable.

In some embodiments, the AWG can be replaced by other type of PWGs such as, at least, Echelle waveguide grating, serial transmission waveguide gratings, serial reflection waveguide gratings, or some kind of optical demultiplexing device comprising waveguide transmission grating, reflection waveguide grating, interleaved waveguide Mach-Zehnder-Interferometers (MZIs), or multiple waveguide Ring-Resonators.

In some embodiments, the electronics and control can be further integrated on same chip as well by employing CMOS technology and process. In some embodiments, the electronics and control may also possess edge-computing capability for complex data processing, in additional to providing laser dive, servo-loop, and data acquisition to the Raman measurement. They can be further integrated on same chip as well by employing CMOS technology and Silicon photonics process resulting in a highly integrated standalone pluggable OE module.

In some embodiments, the optical functionality such coupling laser beam out of the chip and coupling signal or scattering light into the chip can be implemented on PLC as well by CMOS process and Silicon photonics technology.

In the following description and figures, where parts of the system are schematically shown and described as individual functional blocks (e.g., a laser, a PWG, an AWG, a waveguide, and photo-detector, etc.), one of ordinary skill in the art will recognize that the functions of any one individual block may be integrated with the functions of one or more other individual blocks for purposes of implementation. Those of skill in the art will recognize that several of the functional blocks may be integrated according to design choice. Further, those skilled in the art appreciate that the concepts and specific embodiments disclosed herein can be modified, such as by designing certain type of complex waveguide frequency filter incorporating micro-optics on chip, or using a tunable laser with fixed frequency free-space optical demultiplexers or gratings while carrying out the same essential purposes of the present invention. Such equivalent constructions are encompassed by the disclosure of the invention.

Figure 1B:
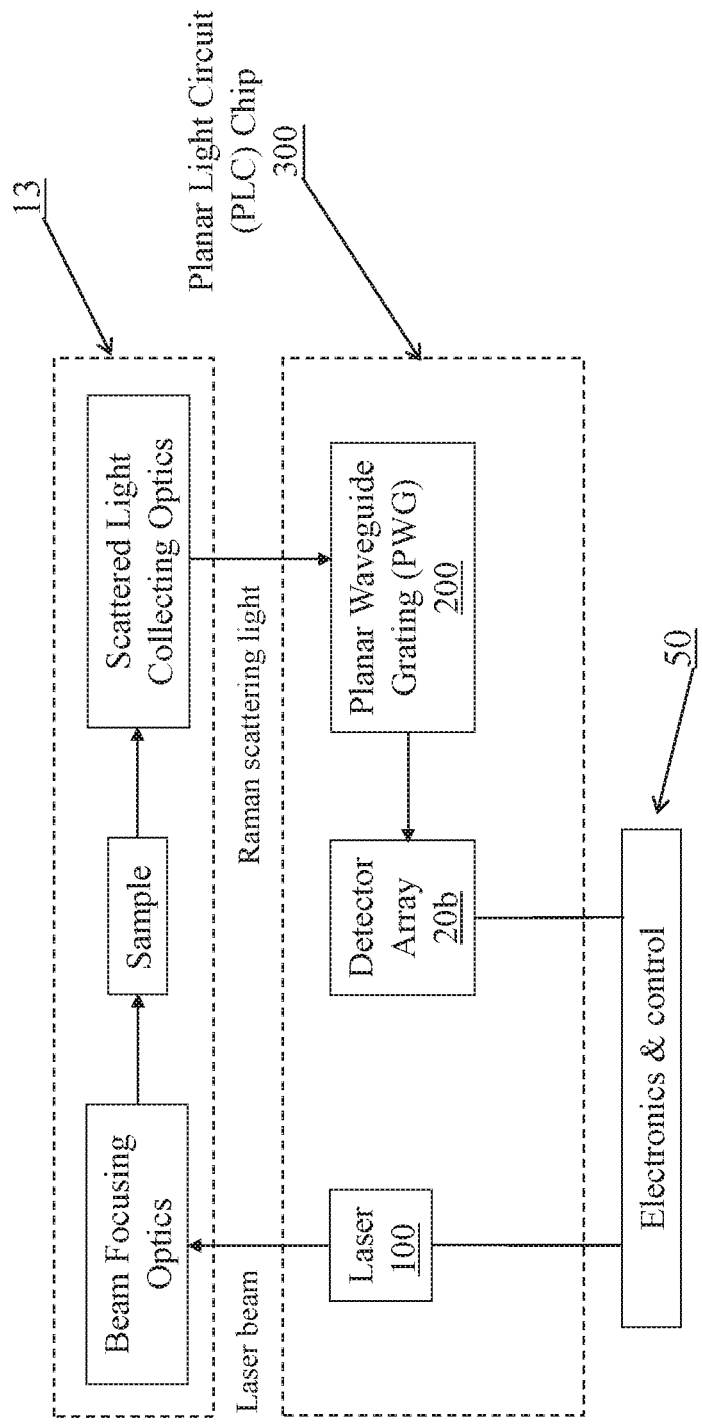
FIG. 1B illustrates a provided embodiment of a chip-based Raman measurement system.

Some embodiments provided as illustrated in FIG. 1B, a system is disclosed as a chip-based planar Raman spectroscopic measurement system 300 with high resolution, high channel count, compact integration, small foot-print, and low cost, all of which are desired for mobile and even in-cell-phone Raman analysis application. The Raman spectroscopic measurement system 300 includes laser 100, which as described can be fixed in frequency in some embodiments or tunable in frequency in others. The output of laser 100 is coupled to external optics 13, which includes both beam forming optics to focus the light on the sample and scattered light collecting optics to couple scattered light to an optical demultiplexer (illustrated as PWG 200). PWG 200 is responsible for frequency demultiplexing the received light into different frequency channels which are coupled to detector array 20*b*. In this embodiment, electronics and control module are illustrated as an external module, but one of ordinary skill in the art would understand that these structures and functions may be performed on the same System on a Chip (SOC) and Raman spectroscopic measurement system 300.

Figure 2A:
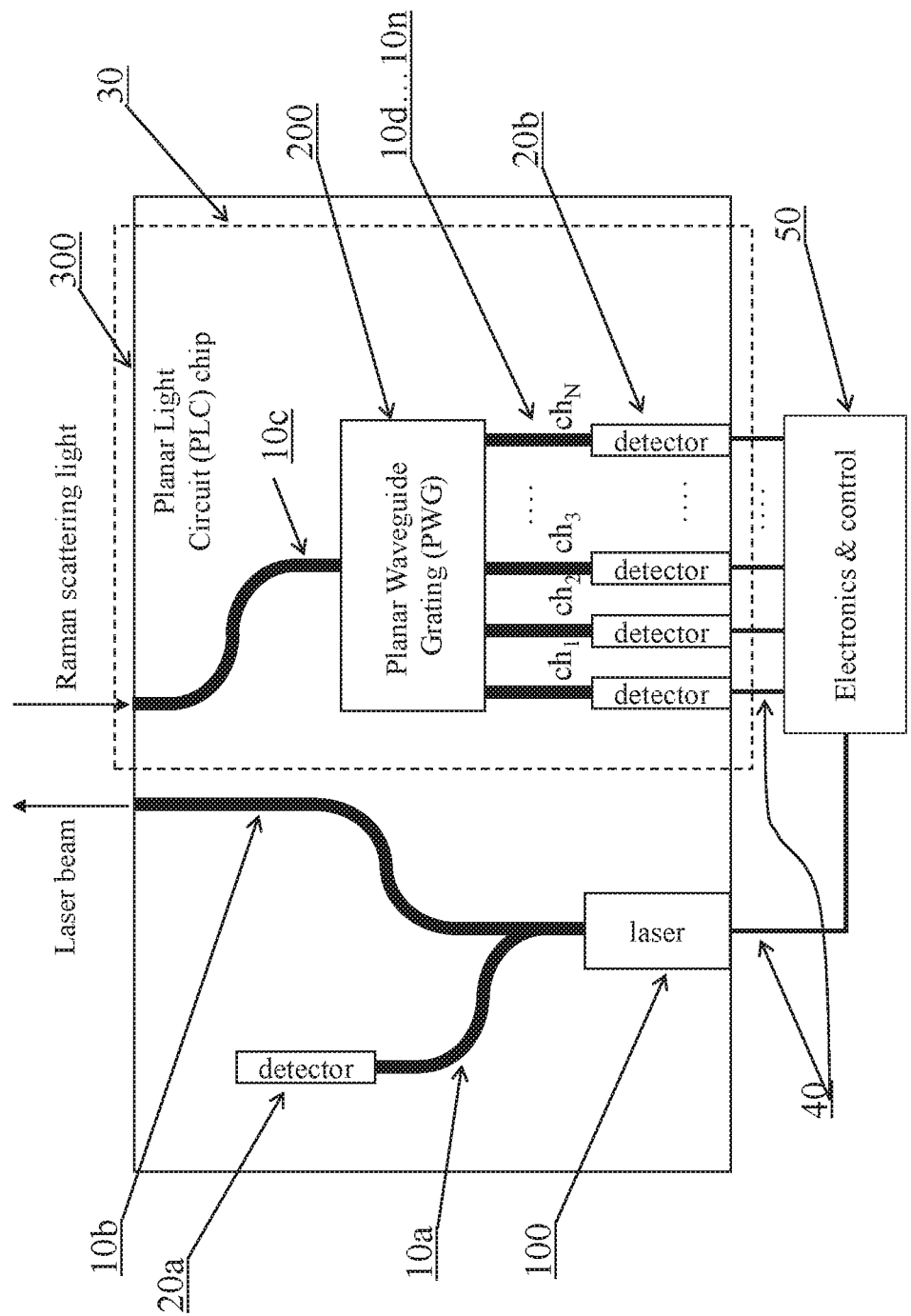
FIG. 2A illustrates a provided embodiment of a simplified plane-view schematic of a chip-based planar Raman spectroscopic measurement system.
Figure 2B:
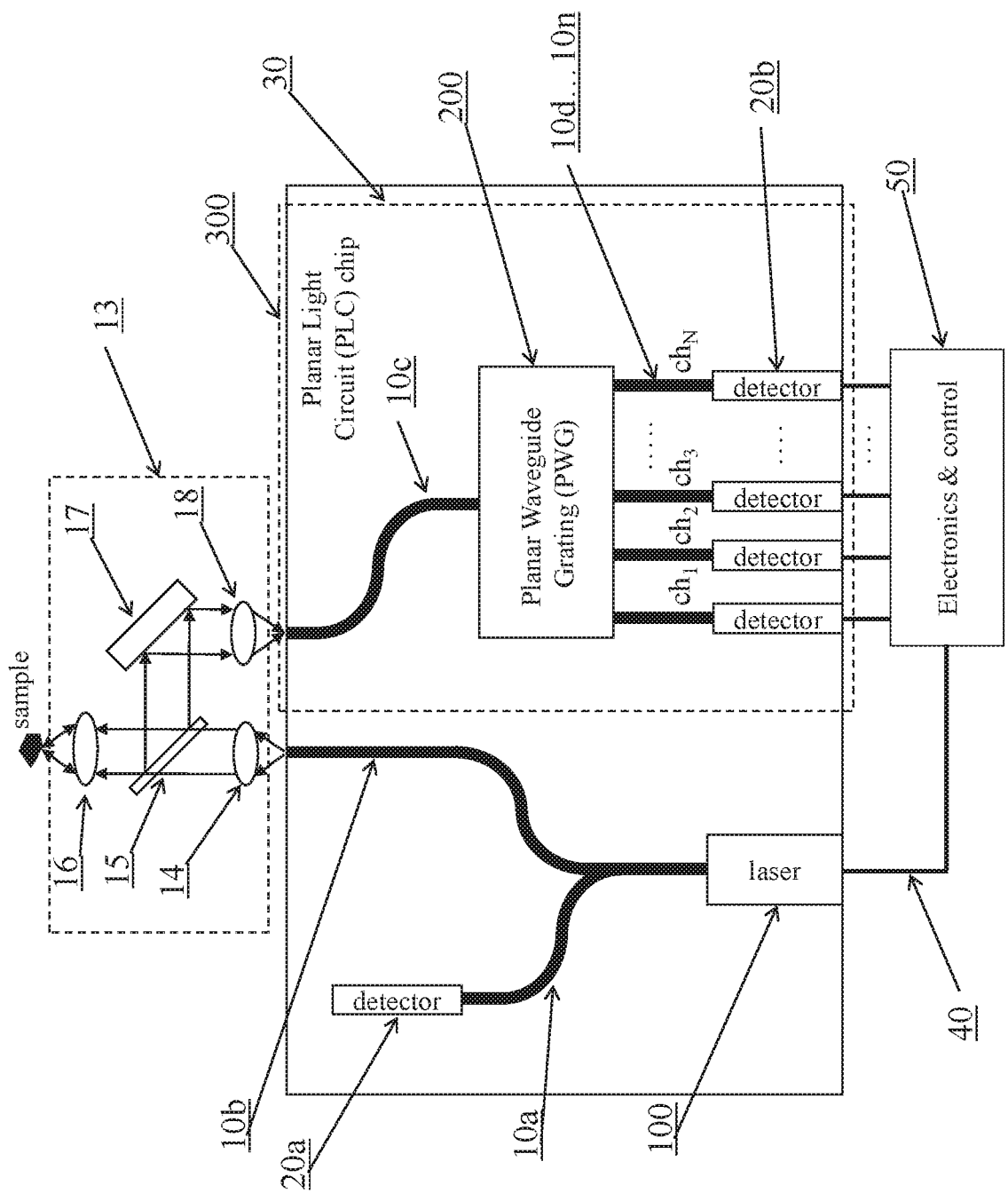
FIG. 2B illustrates a provided embodiment of a simplified schematic of free-space optics added to the system of FIG. 2A.

FIG. 2A and FIG. 2B illustrate an embodiment of a simplified plane-view schematic of a chip-based planar Raman spectroscopic measurement system 300. The planar Raman spectroscopic measurement system 300 includes, laser 100 as excitation light source, a photo-detector 20*a* that monitors the laser optical power, input waveguide 10*c* coupling in the signal light to optical demultiplexer, illustrated as PWG 200, connected with input waveguide 10*c* and an array of output waveguides 10*d* . . . 10*n* for light routing, and an array of photo-detectors 20*b* coupled to the output waveguides 10*d* . . . 10*n* for photon detection and spectral measurement.

As previously noted in some embodiments laser 100 can be frequency tunable or the PWG 200 can be frequency tunable so that spectral information missed in a first data collection due to the spectral characteristics of PWG 200 and associated detector array will be re-captured based on subsequent measurements utilizing different frequency-tuning, leading to an effectively high channel count and high-resolution Raman measurement of the system. The tunable laser or the PWG (that also can be AWG) has a tuning range wider than the largest channel spacing of the PWG.

FIG. 2B further illustrates an additional embodiment of a simplified schematic of free-space optics added to the system of FIG. 2A. The external optics 13 is employed to couple the light to the sample and collect the scattered light from the sample. External optics 13 includes laser beam collimation optics 14, a laser-line-pass-only band-pass optical filter 15, and laser focusing and scattered photon capturing optics 16 coupling light to and from the to sample. Scattered light captured by capturing optics 16 is incident on the laser-line-pass-only band-pass optical filter 15, where it is reflected to wide band reflection mirror 17, which sends captured light to optical coupler 18 which couples the scattered light to Planar Light Chip (PLC) 30. Input light is then routed by waveguide 10*c* to PWG 200. PWG 20 demultiplexes the light from waveguide 10*c* into output waveguides 10*d* . . . 10*n* that guide the light to an array of photo-detectors 20*b*. Photo-detectors 20*b* measures the light present in each channel ch1 . . . chn and constructs a planar spectrometer 30 on chip.

As previously discussed, laser 100 is semiconductor laser such as DFB, DBR, or external cavity laser. The PWG 200 can be an AWG, or other types of waveguide demultiplexing device comprising, at least, an Echelle waveguide grating, serial transmission waveguide gratings, serial reflection waveguide gratings, interleaved waveguide Mach-Zehnder-Interferometers (MZIs), or multiple waveguide Ring-Resonators.

Laser 100 is configured to illuminate a sample of material at a first laser frequency, coupling optics 13 receives scattered first frequency laser light. The received first frequency laser light is demultiplexed 200 into a plurality of different frequency channels. The intensity of light is measured in each of the plurality of channels 10*d* . . . 10*n* and a photo-detector array 20*b* configured to measure the intensity of light in the first plurality of channels. The Laser 100 is further configured to illuminate a sample of the material at a second laser frequency, the coupling optics 13 is further configured to receive scattered second frequency laser light. The received second frequency laser light is further demultiplexed 200 into a plurality of different frequency channels. The intensity of light is further measured in each of the plurality of channels 10*d* . . . 10*n* and the photo-detector array 20*b* further configured to measure the intensity of light in the second plurality of channels.

As with other embodiments, other components illustrated in FIGS. 2A and 2B, such as electronics and control module 50 can be external to the chip or can be on a larger SOC integrated with PLC 30. The tunable laser or PWG (or AWG) can have a tuning range wider than the frequency separation of neighboring plurality of channels Electronics and control module 50 can be used for laser drive and tuning control, PWG tuning control, photo-detector OE conversion, and spectral data acquisition and analysis. In some embodiments, electronics and control module 50 can be connected to the chip-based planar Raman spectroscopic measurement system 300 using electronic interface 40.

Figure 3:
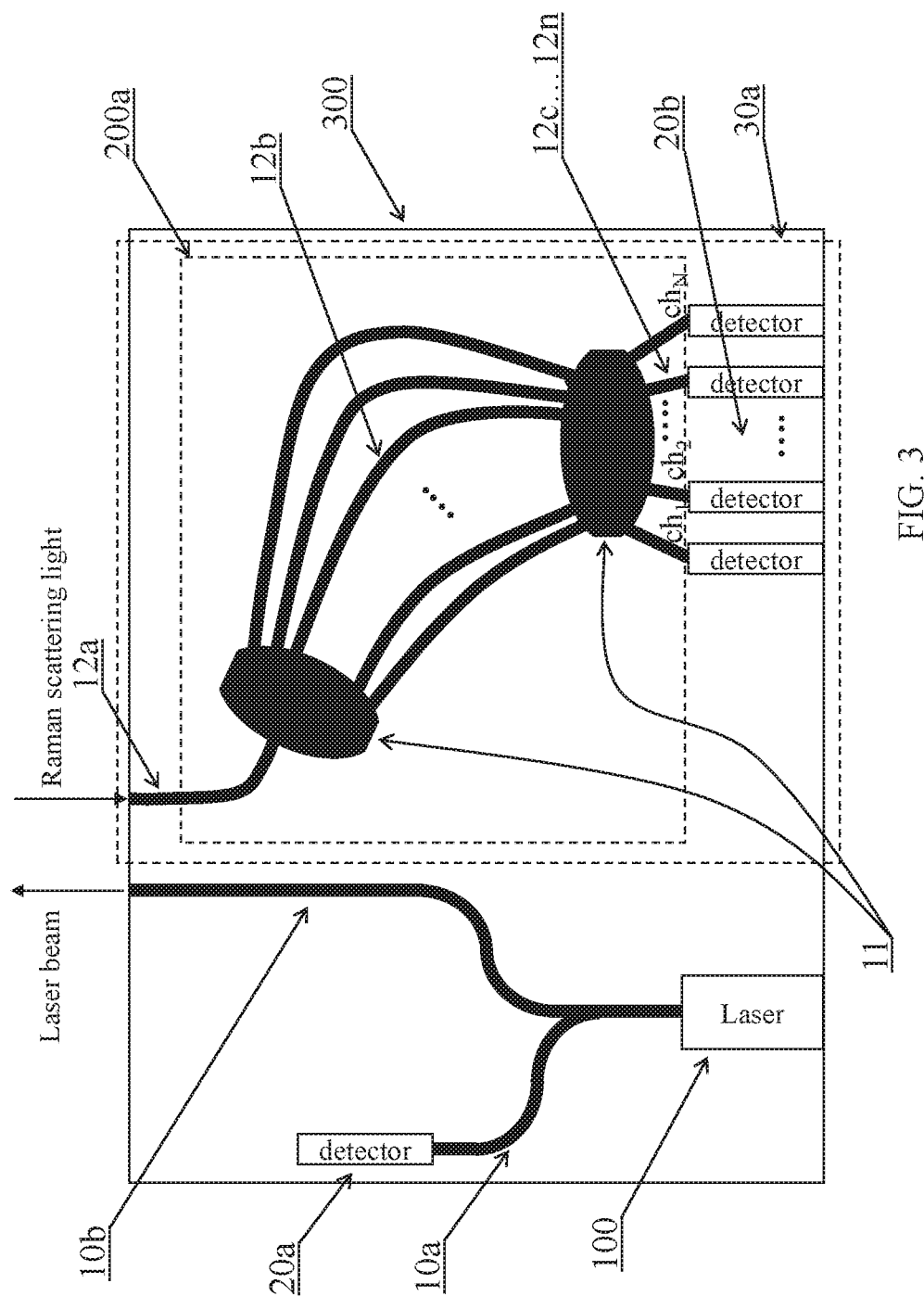
FIG. 3 is a diagram illustrating a provided embodiment of a simplified schematic of a chip-based planar Raman spectroscopic measurement system based on Arrayed Waveguide Grating (AWG)

FIG. 3 is a diagram illustrating a simplified schematic of a chip-based planar Raman spectroscopic measurement system based on AWG 30*a*. In some embodiments, the PWG can be an AWG 200*a*. AWG has been widely used in fiber optical communication for frequency multiplexing and de-multiplexing. When being used as optical dispersion element in the planar spectrometer 30, the AWG 200*a* operates in de-multiplexing mode as a transmission grating. The AWG-based planar spectrometer 30*a* comprises, at least, input waveguide 12*a*, star couplers 11, arrayed waveguides 12*b*, AWG 200*a*, and an array of output waveguides 12*c* . . . 12*n*, and array of photo-detectors 20*b* connected to output waveguides 12*c* . . . 12*n*.

When a beam of polychromatic light is coupled into the input waveguide 12*a*, the light is diffracted and dispersed after traveling through the AWG 200*a*, and some of the light is coupled to the output waveguides array 12*c* . . . 12*n* and further to the photo-detector array 20*b* for the light or photon intensity measurement. By theory each waveguide channel in the output waveguide array 12*c* . . . 12*n* couples in only the light at a particular frequency pre-defined to that waveguide channel with certain spectral distribution (typically a Gaussian). The light that is not coupled to the output waveguides will be lost as radiation in the chip.

Figure 4:
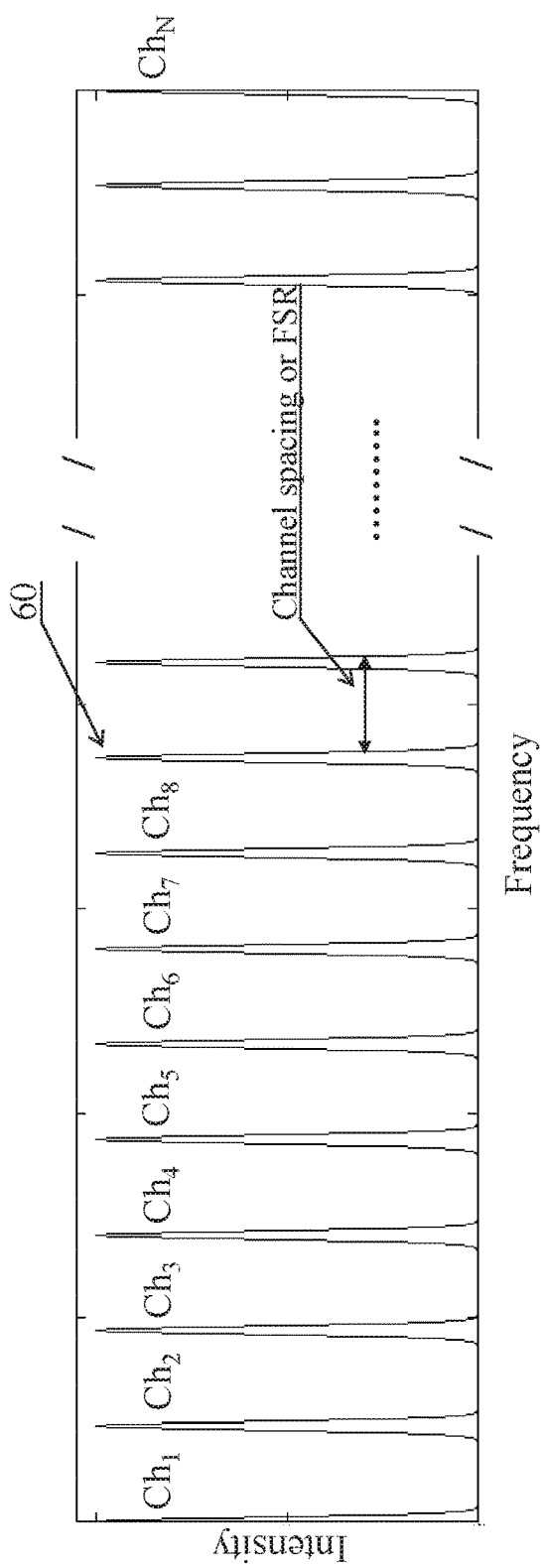
FIG. 4 is a diagram illustrating an exemplary optical transmission spectrum of the AWG consistent with embodiments of the invention.

FIG. 4 is a diagram illustrating an exemplary optical transmission spectrum of the AWG 200*a*. The transmission frequency spectrum of an AWG is characterized by a comb of peaks or channels 60. Each peak represents the optical transmission of the corresponding output waveguide channel 12*c* . . . 12*n*. The channels are typically of Gaussian line-shape or profile and separated with equal frequency separation that is called channel spacing or Free-Spectra-Range (FSR). The frequency of the peaks, number of channels, and channel spacing or FSR, can all be determined by design. The spectral range or coverage of the AWG is determined by its channel spacing and number of channels.

Typically the channel spacing of an AWG is 0.4 nm or 0.8 nm, corresponding to 50 GHz or 100 GHz, in the telecommunication wavelength region of ~1550 nm, and the number of channels is usually 80 or 40, that covers a spectral range of 32 nm. AWG with different channel spacing or number of channels is also achievable, such as 1.6 nm of channel spacing and 20 or more for number of channels, for example.

With an array of photo-detectors 20*b* connected or coupled to the output waveguides 12*c* . . . 12*n*, the light intensity in each output waveguides 12*c* . . . 12*n* is measured. Plotting the intensity versus the channel frequency, a spectrum of the signal light entering Planar spectrometer based on AWG 30*a* is obtained. The spectral resolution of such AWG-based spectrometer is determined by the frequency bandwidth of the channels 60 in FIG. 4 that is usually a fraction of the channel spacing. For an AWG with a typical channel spacing of 0.8 nm, or ~10/cm of spectral range in the wavelength region of 785 nm, the spectral resolution can be only a few of 1/cm, better than most mobile or hand-held Raman analyzer on market today. The resolution can be designed to be even better, say below 1/cm, close to that of stand-alone lab-grade Raman spectrometers.

Figure 5:
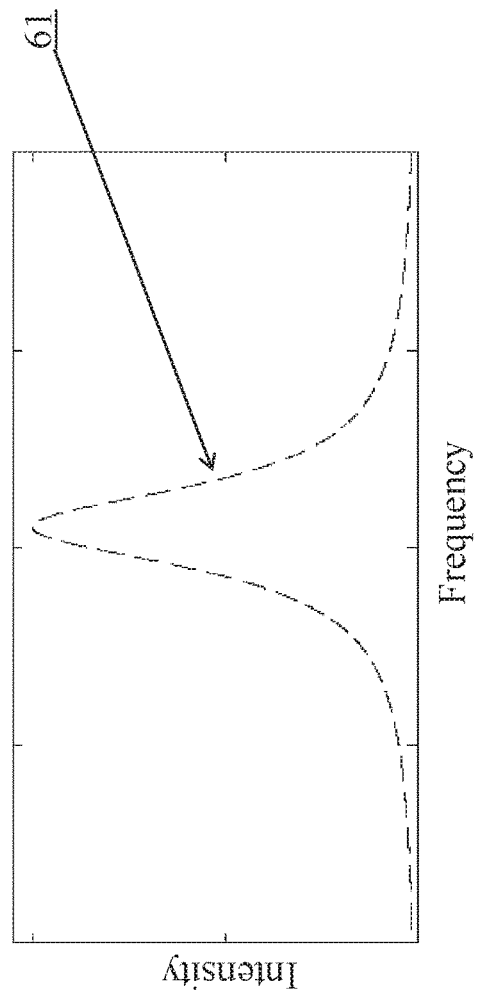
FIG. 5 is a diagram illustrating an exemplary Raman scattering curve of a molecular vibration consistent with embodiments of the invention.

FIG. 5 is a diagram illustrating an exemplary Raman scattering curve 61 from a molecular vibration.

Figure 6A:
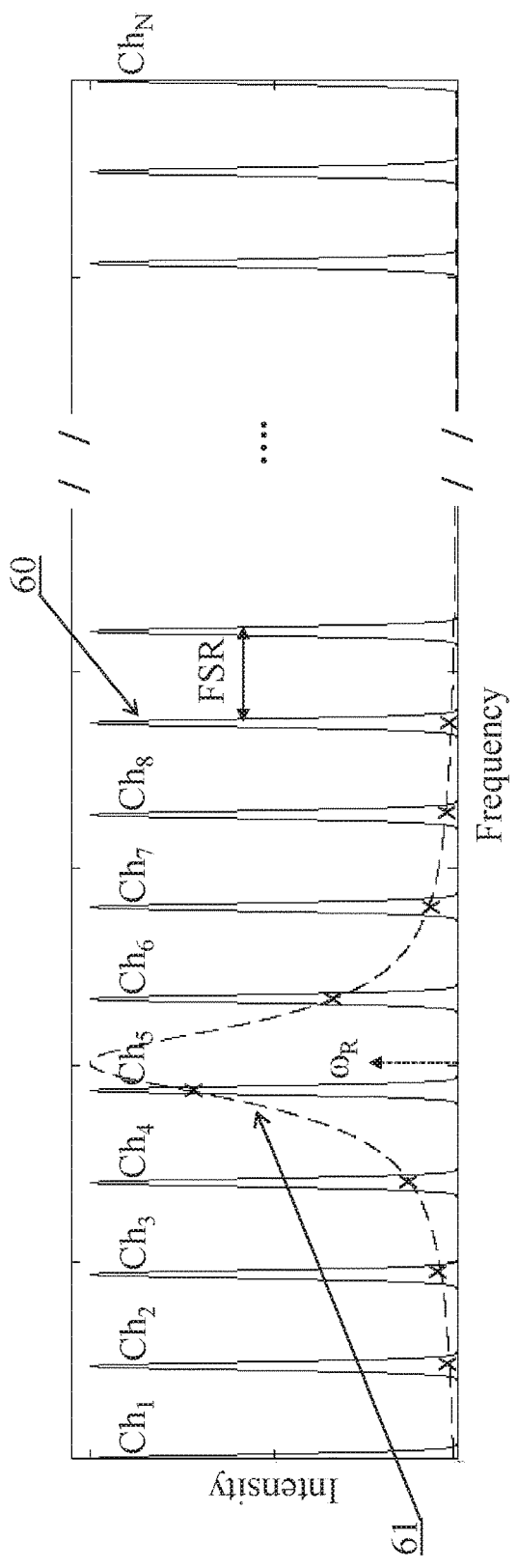
FIG. 6A is diagram illustrating the Raman measurement of a Raman scattering curve with a fixed-frequency AWG-based planar spectrometer and laser consistent with embodiments of the invention.

FIG. 6A illustrates the spectral measurement of the Raman scattering curve 61 with a planar spectrometer based on an AWG of fixed frequency and a fixed frequency laser, where only parts of the Raman scattering curve overlapped with the detection channels, as marked by the "x" in FIG. 6A, get measured. The information on other parts of the Raman scattering curve 61 such as these falling in the channel spacing is missing and left blank, resulting in a coarse or less informative measurement 62 of the original Raman scattering curve 61 as illustrated in FIG. 6B where the measurement result 61 is re-plotted, although the AWG or AWG-based planar spectrometer offers high spectral resolution per frequency channel.

Figure 6B:
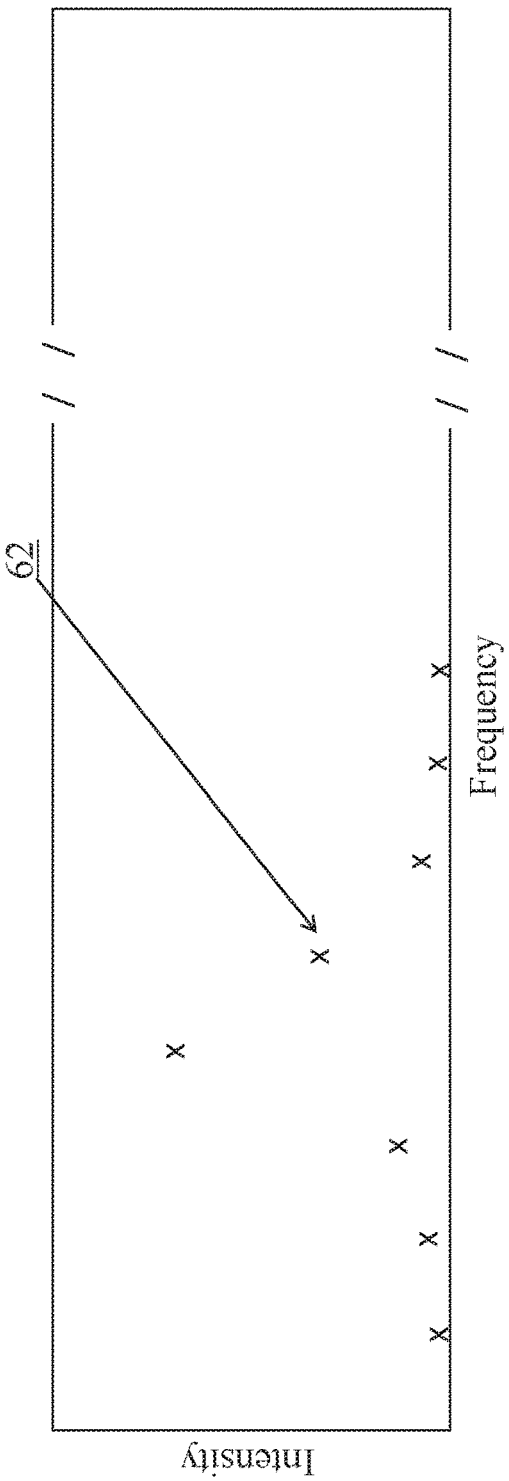
FIG. 6B illustrates the replot of the Raman measurement results of FIG. 6A consistent with embodiments of the invention.

FIG. 6B illustrates the replot of the Raman measurement results of FIG. 6A.

FIG. 7A-7E are the diagrams illustrating the step by step measurements of a Raman scattering curve with a fixed frequency AWG and a tunable laser.

Either laser 100 is frequency tunable or the PWG 200 or AWG 200a is frequency-tunable in the chip-based planar Raman spectroscopic measurement system 300. Utilizing a method based on the frequency tuning the said missing Raman spectral information can be re-captured leading to a high channel account, high spectral resolution, and high sensitivity Raman measurement of system.

For example, laser 100 is a frequency tunable laser and the PWG 200 is an AWG 200 of fixed frequency in the Planar spectrometer based on AWG 30a.

According to equation (1), the frequency of the laser $\omega_L$, the frequency of the Stokes-Raman scattered photons $\omega_R$, and the frequency of the Raman active vibration of molecular $\gamma_R$ are related by $$\omega_R = \omega_L - \gamma_R \quad (1)$$

When the frequency of the laser $\omega_L$ is changed, the frequency of the Raman scattering $\omega_R$ of the vibration $\gamma_R$ will change too. In another word, if the frequency of the laser is tuned from low to high frequency in the Raman measurement, the Raman scattering of the vibration will move from low to high frequency as well in the spectra in the same frequency amount as the laser tuning while the frequency of the vibration $\gamma_R$ remains the same.

In today's laser technology, a spectral line-width of sub-GHz or even sub-MHz that is less than the channel spectral resolution of a typical AWG, and a tuning range of few nm or even 10+ nm that is much wider than the channel spacing of a typical AWG, are widely commercially available for tunable semiconductor lasers.

FIG. 7A-7E illustrate different parts Raman scattering curve of the vibration 64, 65, 66, 67, 68 measured when laser 100 is a frequency tunable laser with a narrow linewidth and a tuning range wider than the channel spacing of AWG. Laser 100 is tuned in an adequate small frequency amount of δ step by step in the Raman measurement to cover a full spectral range of channel spacing of the AWG, and the Raman scattering of the vibration 61 is measured correspondingly at each laser tuning step with the AWG planar spectrometer 30a. The frequency tunability of laser 100 will in fact bring the Raman scattering curve 61 scanned against the plurality channels of the AWG planar spectrometer 30a in spectra.

FIG. 7F is a diagram plotting the measurement results of FIG. 7A to 7E together taking into account the laser tuning. Considering the laser turning effect and plotting measurement result from each turning together in one plot 69, a much finer spectral measurement of the Raman scattering curve 61 is obtained.

Employing the provided embodiments, the spectral information missed within the channel spacing or FSR, as shown in FIG. 6B of fixed frequency laser and AWG, is recaptured in a time multiplexing manner, resulting a high detection channel count and high-resolution Raman measurement 69 as in FIG. 7F with planar Raman spectroscopic measurement system 300.

The total number of channels of the AWG, typically 40 or 80 in optical communication, is very small as compared to the number of pixels in a CMOS or CCD array used in today's Raman spectrometer where usually 1024 or 2048 detector elements are required, only a few tens of PIN or APD (Avalanche Photo-Detector) PDs are needed here meaning a lower-cost with high sensitivity planar Raman spectroscopic measurement system 300.

Figures 8C, 8D:
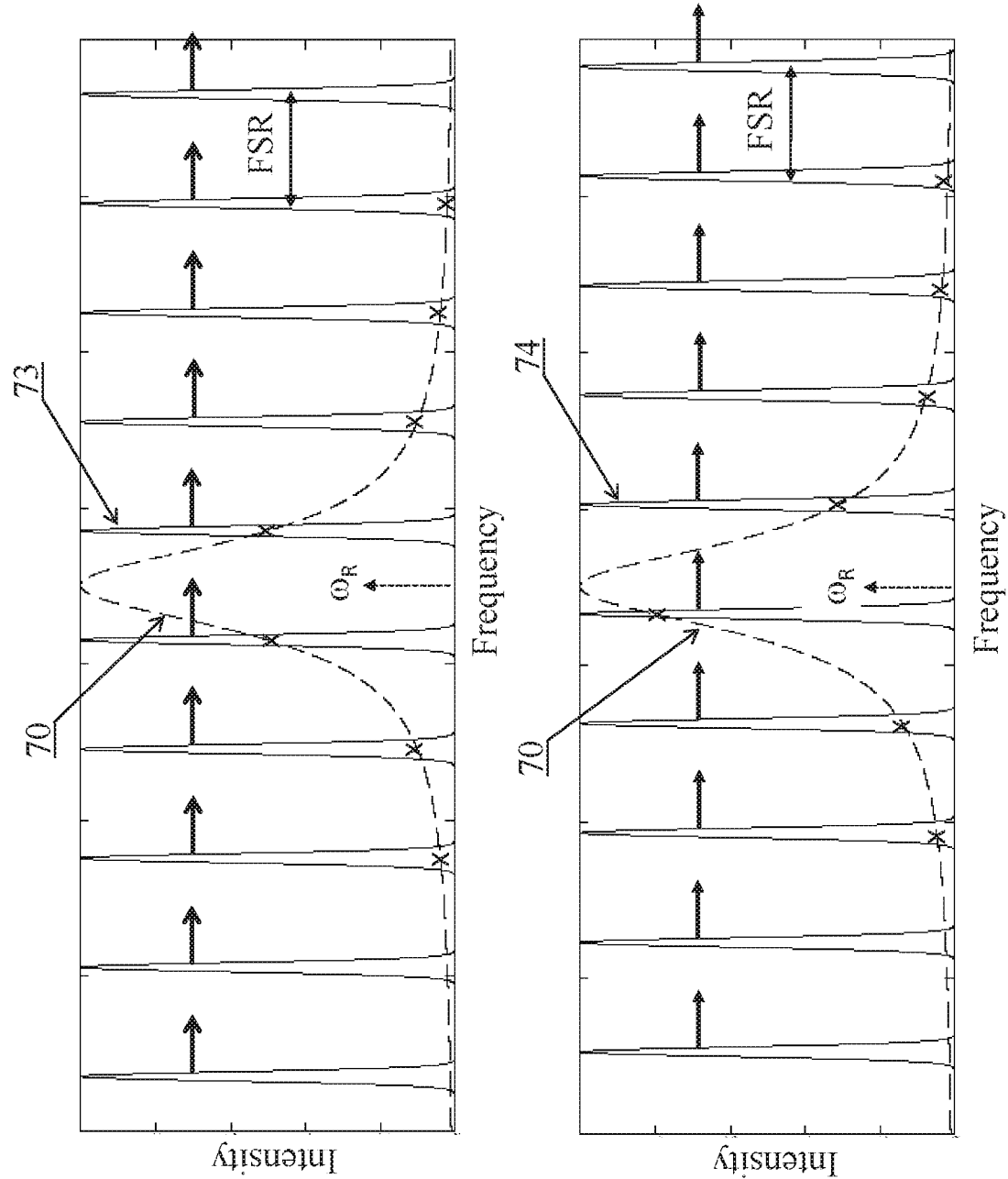
Figure 8E:
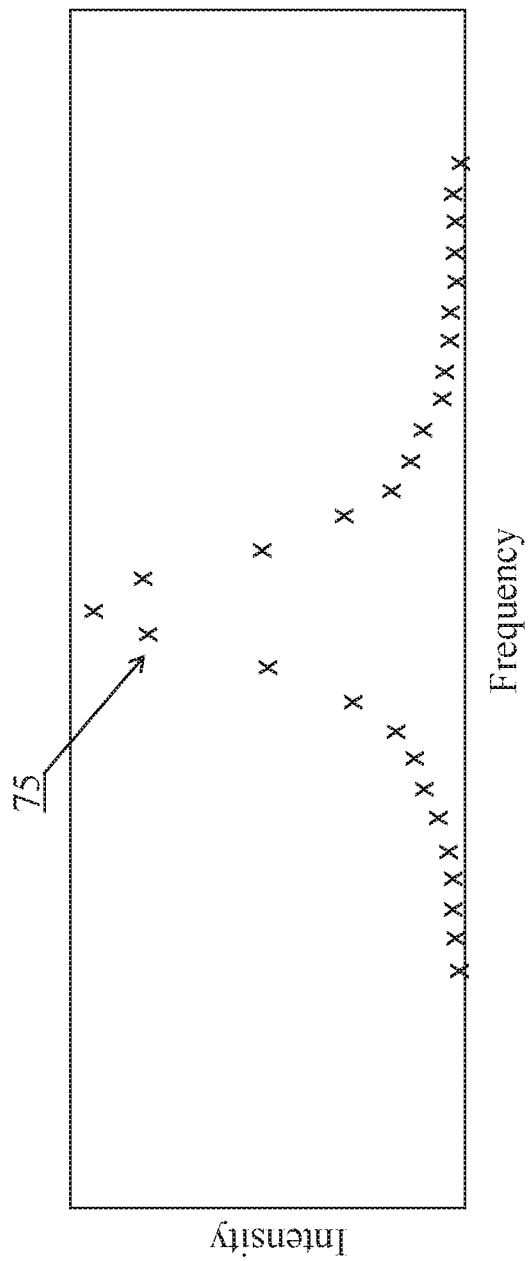
FIG. 8E illustrates the final result of plotting the measurement results of FIG. 8A to FIG. 8D together consistent with embodiments of the invention.

FIG. 8A-8D are the diagrams illustrating the step by step measurement of a Raman scattering curve with frequency tunable AWG and a fixed frequency laser and FIG. 8E illustrates the final result of plotting the measurement results of FIG. 8A to FIG. 8D together.

For example, laser 100 operates at a fixed frequency, and the PWG 200 is an AWG 200 that is a frequency-tunable in the planar spectrometer based on AWG 30a with a tuning range wider than its channel spacing.

Raman scattering curve 61 under measurement stays at fixed absolute frequency, but AWG is tuned in an adequate frequency amount step by step to cover a full spectral range of its channel spacing and the Raman spectrum is measured correspondingly at each tuning step by the AWG planar spectrometer. This way the combination of detection channels will scan across the Raman scattering curve together in step with different parts of the curve being measured each time as illustrated in FIG. 8A-8E, the spectral information missed in the channel spacing as with the case of fixed frequency AWG and laser is captured similarly as in FIG. 7F, and an effectively high channel count detection 75 as illustrated in FIG. 8E and high resolution measurement of the Raman scattering curve is achieved with planar Raman spectroscopic measurement system 300.

AWG can be replaced by other type of PWGs including, at least, Echelle waveguide grating, serial transmission waveguide gratings, serial reflection waveguide gratings, or some kind of optical demultiplexing device comprising waveguide transmission grating, reflection waveguide grating, interleaved waveguide Mach-Zehnder-Interferometers (MZIs), or multiple waveguide Ring-Resonators.

Figure 9:
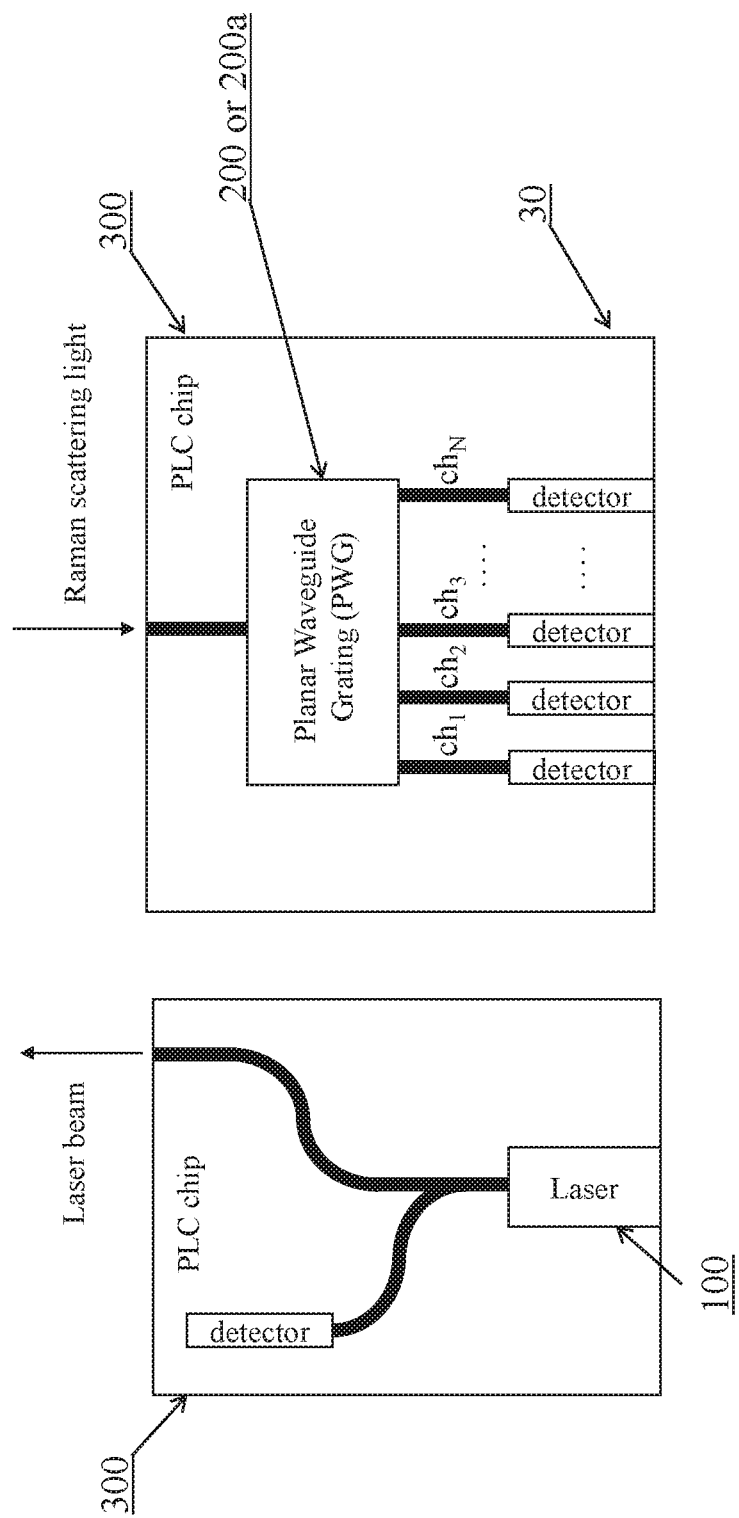
FIG. 9 illustrates a provided embodiment simplified schematic where the laser and the planer spectrometer can be on separate chips.

FIG. 9 illustrates a simplified schematic that the laser and the planer spectrometer can be on separate chips. In some embodiments, the stand-alone laser 100 and planar spectrometer 30 can be on separated chips to construct a planar Raman spectroscopic measurement system 300 where different planar spectrometers can be used as interchangeable modules with same laser for flexible spectral measurement. In provided embodiments, either the laser 100 or PWG 200 (or AWG 200a) is frequency tunable.

Figure 10:
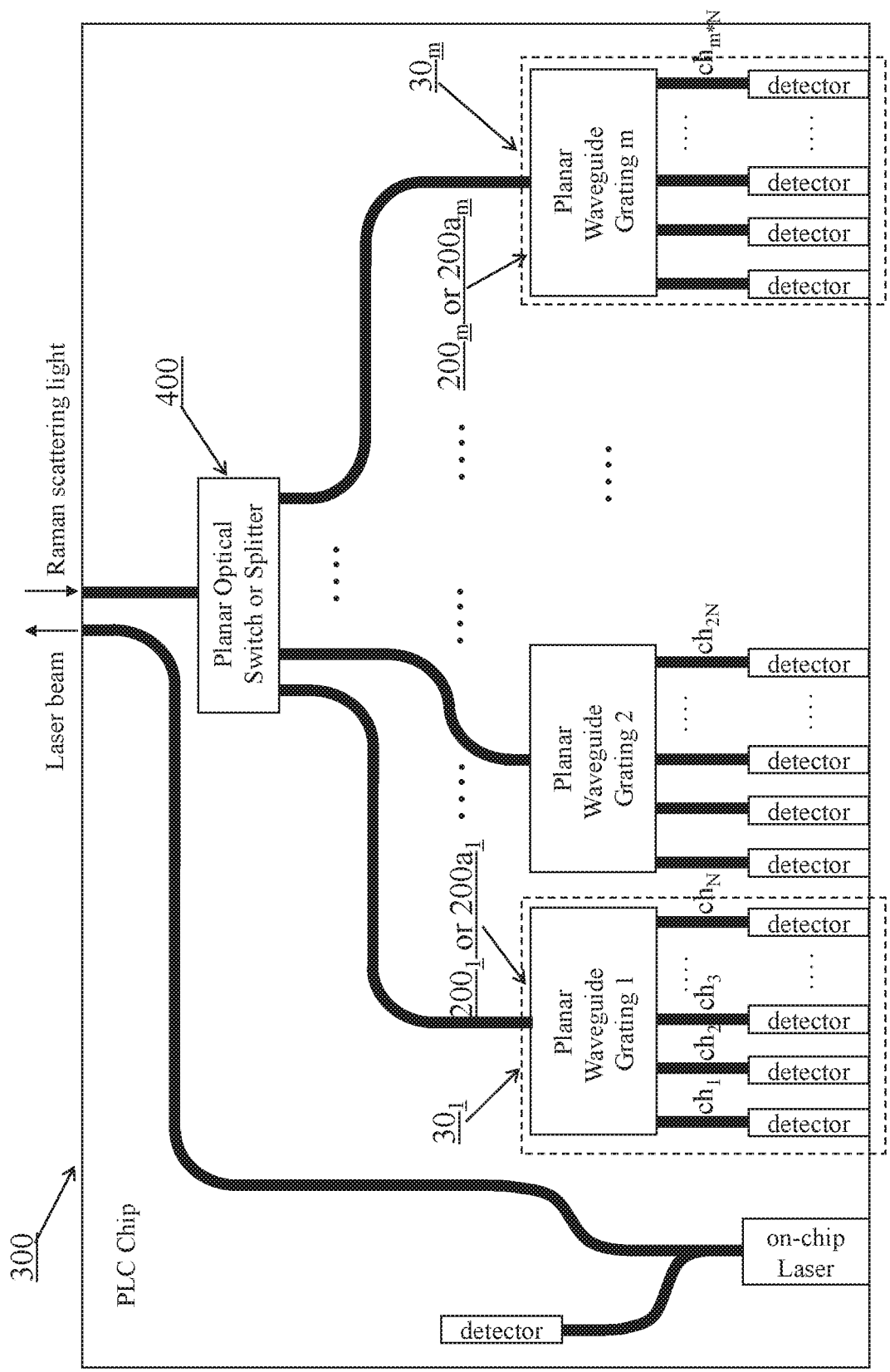
FIG. 10 illustrates simplified schematic consistent with embodiments of the invention where the laser and more planar spectrometers can be integrated on same chip.

FIG. 10 illustrates a provided embodiment of a simplified schematic that the laser and more planar spectrometers integrated can be on same chip. Additional PWG 200 (or AWG 200a)-based planar spectrometer 30 (or planar spectrometer based on AWG 30a) of different center frequency and spectral range are employed. In these embodiments, laser 100 is integrated on the PLC chip to expand spectral region and range of the chip-based planar Raman spectroscopic measurement system 300. In some embodiments, a planar optical switch or splitter 400 is used to direct the signal light between these planar spectrometers through routing waveguides 200. Like other embodiments, either laser 100 is frequency tunable or PWG 200 (or AWG 200a) is frequency tunable.

Figure 11A:
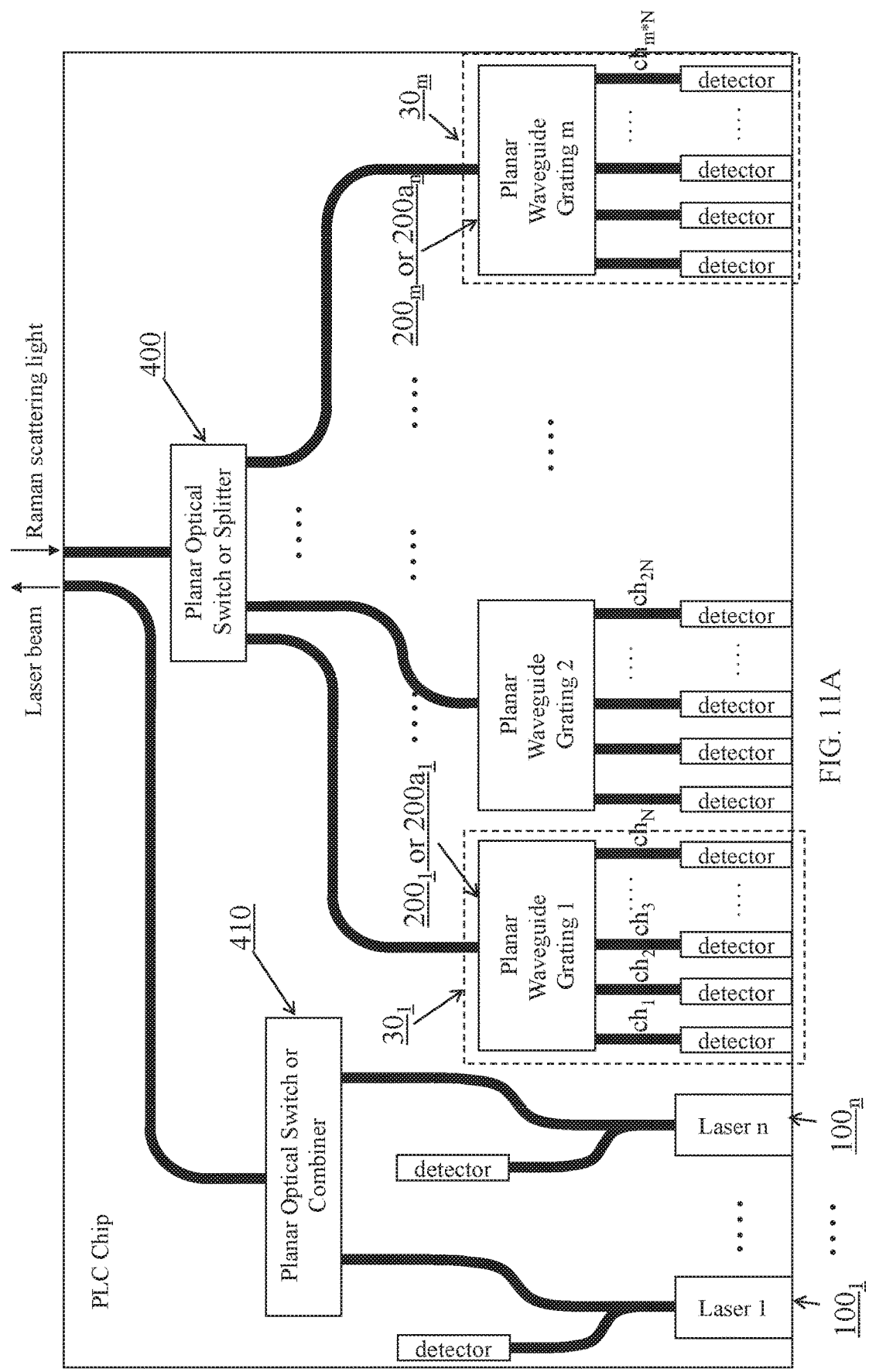
FIG. 11A illustrates a simplified schematic consistent with embodiments of the invention illustrating additional lasers and planar spectrometers integrated on same chip.
Figure 11B:
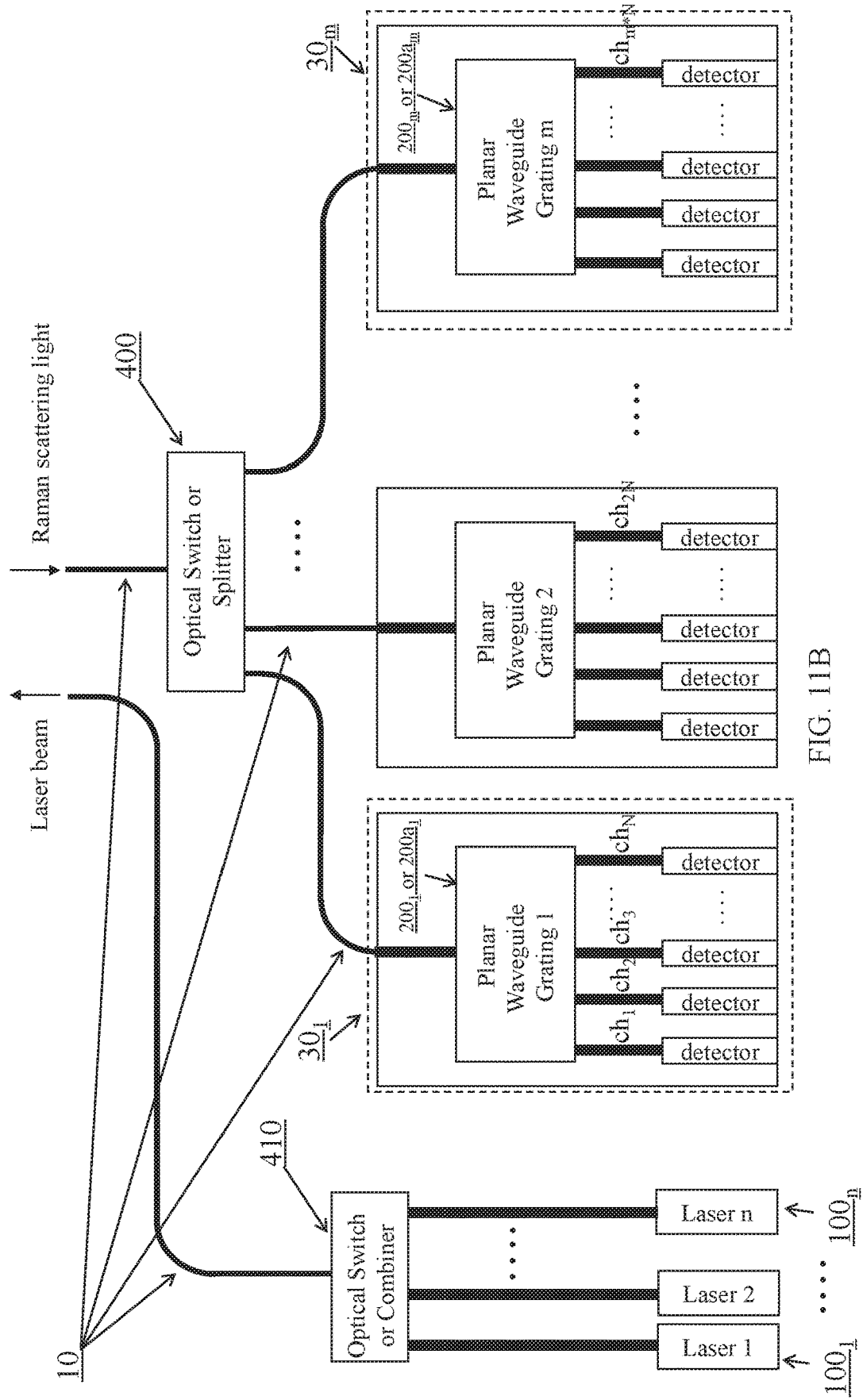
FIG. 11B is a diagram illustrating a simplified schematic a consistent with embodiments of the invention showing additional lasers planar spectrometers incorporated as discrete components.

FIG. 11A illustrates a provided embodiment of a simplified schematic that additional lasers 100 and more planar spectrometers 30 can be integrated on same chip and FIG. 11B is a diagram illustrating a provided embodiment of a simplified schematic where additional lasers 100 and additional planar spectrometers 30 can be incorporated as discrete components.

The use of additional lasers 100 at different center frequency and one or more PWG 200 (or AWG 200a) based planar spectrometer 30 (or Planar spectrometer based on AWG 30a) of different spectral region can be incorporated, through on-chip integration as shown in FIG. 11A or as discrete component shown in FIG. 11B. These embodiments provide a more flexible and wider spectral range Raman measurement of the system. In these embodiments, either the laser 100 is frequency tunable or PWG 200 (or AWG 200a) is frequency tunable.

Figure 12:
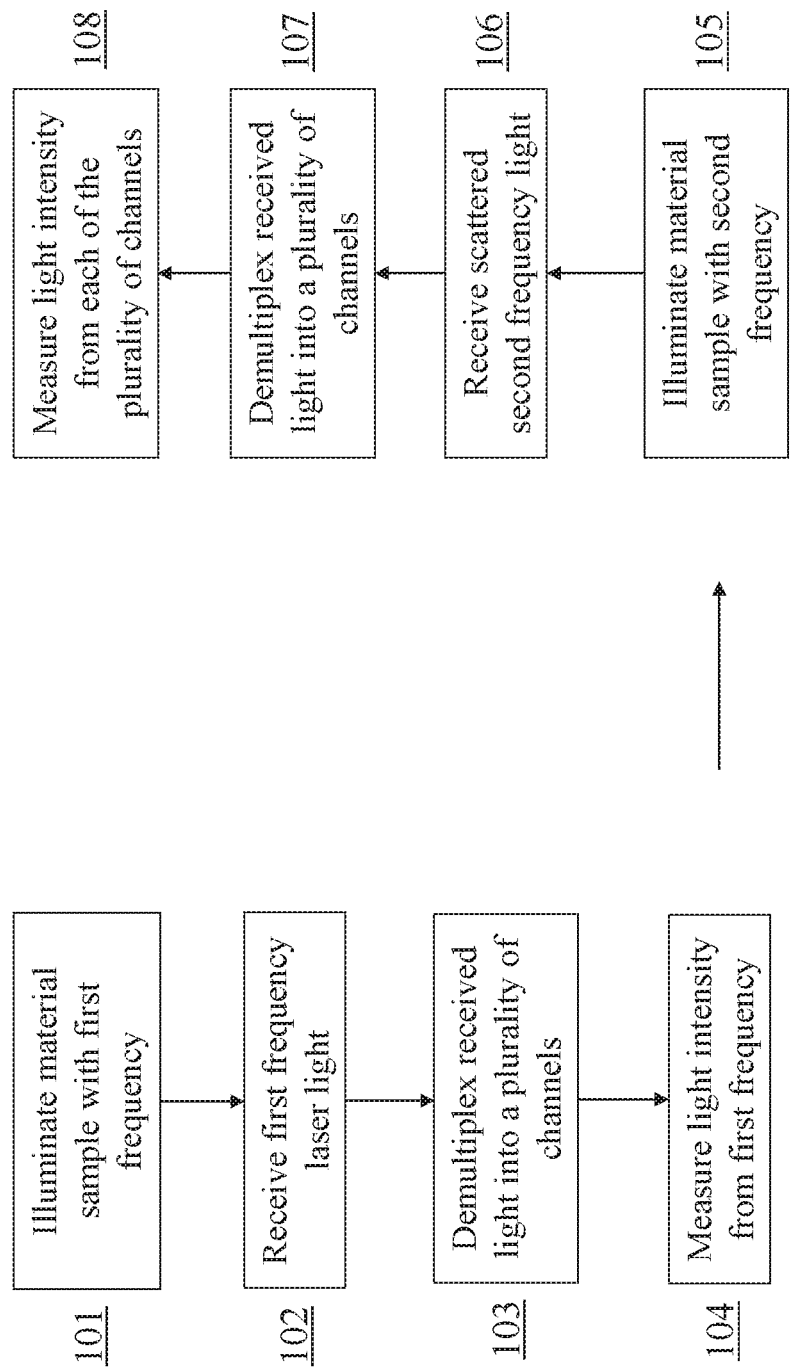
FIG. 12 illustrates the flow of a method consistent with embodiments of the invention.

FIG. 12 illustrates the flow of a method consistent with embodiments of the invention. Flow of the operation of planar Raman spectroscopic measurement system 300 begins with the illumination of a sample with laser light at a first frequency 101. Flow continues to block 102 where planar Raman spectroscopic measurement system 300 received scattered first frequency laser light. In 103 the received light is demultiplexed into a plurality of channels and in step 104 the intensity of light is measured in each of the plurality of channels. Flow of the method continues to 105, where the sample is illuminated with laser light at a second frequency. In step 106, scattered second frequency light is received by planar Raman spectroscopic measurement system 300. In 107 this received light is demultiplexed into a plurality of channels, and in step 108 the intensity of light is measured in each of the plurality of channels.

In some embodiments the first frequency of laser light and the second frequency of laser light are different in that the laser has been tuned to a different frequency prior to the second illumination of the sample. In other embodiments, the first and second laser frequencies are the same and the center frequency of each of the plurality of channels is changed from the first illumination to the second illumination.

While the principles of the disclosure have been illustrated in relation to the exemplary embodiments shown herein, the principles of the disclosure are not limited thereto and include any modification, variation or permutation thereof.

What is claimed is:

1. A method of material characterization comprising:
   illuminating a sample of a material at a first laser frequency;
   receiving light scattered from illumination of the sample at the first laser frequency;
   demultiplexing the received scattered first frequency light into a first plurality of channels;
   measuring intensity of light in each of the first plurality of channels to form a first measurement;
   illuminating the sample of the material at the second laser frequency;
   receiving light scattered from illumination of the sample at the second laser frequency;
   demultiplexing the received scattered second frequency light into a second plurality of channels;
   measuring intensity of light in each of the second plurality of channels to form a second measurement; and
   processing the first and the second measurements to characterize the material.

2. The method of claim 1, further comprising monitoring the optical power of the laser.

3. The method of claim 1, wherein the demultiplexing is accomplished by a planar waveguide grating.

4. The method of claim 3, wherein the planar waveguide grating is a fixed frequency arrayed waveguide grating.

5. The method of claim 3 wherein the first and second laser frequencies are different frequencies and the planar waveguide is a fixed frequency arrayed waveguide grating.

6. The method of claim 1 wherein the laser is a semiconductor laser.

7. An apparatus comprising:
   a laser configured to illuminate a sample of material at a first laser frequency;
   a waveguide configured to receive light scattered by the illumination of the sample with the light at the first laser frequency;
   a demultiplexer configured to receive the scattered first frequency light and to demultiplex it into a first plurality of channels;
   a detector array configured to measure the intensity of light in the first plurality of channels; and
   wherein the laser is further configured to illuminate the sample of the material at a second laser frequency, the waveguide is further configured to receive light scattered by the illumination of the sample with the light at the second laser frequency, the demultiplexer further configured to receive the scattered second frequency light and to demultiplex it into a second plurality of channels, and the detector array further configured to measure the intensity of light in the second plurality of channels.

8. The apparatus of claim 7, further comprising a detector configured to monitoring the optical power of the laser.

9. The apparatus of claim 7, wherein the demultiplexer is a planar waveguide grating.

10. The apparatus of claim 9, wherein the planar waveguide grating is a fixed frequency arrayed waveguide grating.

11. The apparatus of claim 9, wherein the first and second laser frequencies are different frequencies and the planar waveguide is a fixed frequency arrayed waveguide grating.

12. The apparatus of claim 7 wherein the laser is a semiconductor laser.

13. A method of material characterization comprising:
   illuminating a sample of a material at a first laser frequency;
   receiving light scattered from illumination of the sample at the first laser frequency;
   demultiplexing the received scattered first frequency light into a first plurality of channels;
   measuring intensity of light in each of the first plurality of channels to form a first measurement;

illuminating the sample of the material at the second laser frequency;
receiving light scattered from illumination of the sample at the second laser frequency;
demultiplexing the received scattered second frequency light into a second plurality of channels;
measuring intensity of light in each of the second plurality of channels to form a second measurement;
processing the first and the second measurements to characterize the material; and
wherein the bandwidth of each of the first and the second plurality of channels is less than the bandwidth of a scattering curve of a Raman active vibration for the material.

14. A method of material characterization comprising:
illuminating a sample of a material at a first laser frequency;
receiving light scattered from illumination of the sample at the first laser frequency;
demultiplexing the received scattered first frequency light into a first plurality of channels;
measuring intensity of light in each of the first plurality of channels to form a first measurement;
illuminating the sample of the material at the second laser frequency;
receiving light scattered from illumination of the sample at the second laser frequency;
demultiplexing the received scattered second frequency light into a second plurality of channels;
measuring intensity of light in each of the second plurality of channels to form a second measurement;
processing the first and the second measurements to characterize the material;
wherein the demultiplexing is accomplished by a planar waveguide grating; and
wherein the first and second laser frequency are the same frequency and the planar waveguide grating is a frequency tunable arrayed waveguide grating.

15. The method of claim 14, wherein the tunable arrayed waveguide grating has a tuning range wider than its channel spacing.

16. A method of material characterization comprising:
illuminating a sample of a material at a first laser frequency;
receiving light scattered from illumination of the sample at the first laser frequency;
demultiplexing the received scattered first frequency light into a first plurality of channels;
measuring intensity of light in each of the first plurality of channels to form a first measurement;
illuminating the sample of the material at the second laser frequency;
receiving light scattered from illumination of the sample at the second laser frequency;
demultiplexing the received scattered second frequency light into a second plurality of channels;
measuring intensity of light in each of the second plurality of channels to form a second measurement;
processing the first and the second measurements to characterize the material;
wherein the demultiplexing is accomplished by a planar waveguide grating; and
wherein the laser has a frequency tuning range suitable to re-capture missing spectral information due to the spectral characteristics of the planar waveguide grating.

17. A method of material characterization comprising:
illuminating a sample of a material at a first laser frequency;
receiving light scattered from illumination of the sample at the first laser frequency;
demultiplexing the received scattered first frequency light into a first plurality of channels;
measuring intensity of light in each of the first plurality of channels to form a first measurement;
illuminating the sample of the material at the second laser frequency;
receiving light scattered from illumination of the sample at the second laser frequency;
demultiplexing the received scattered second frequency light into a second plurality of channels;
measuring intensity of light in each of the second plurality of channels to form a second measurement;
processing the first and the second measurements to characterize the material;
wherein the laser is a semiconductor laser; and
wherein the semiconductor laser has an external cavity laser built on the chip with III-V gain chip as photon source and an external waveguide grating that provides feedback.

18. An apparatus comprising:
a laser configured to illuminate a sample of material at a first laser frequency;
a waveguide configured to receive light scattered by the illumination of the sample with the light at the first laser frequency;
a demultiplexer configured to receive the scattered first frequency light and to demultiplex it into a first plurality of channels;
a detector array configured to measure the intensity of light in the first plurality of channels;
wherein the laser is further configured to illuminate the sample of the material at a second laser frequency, the waveguide is further configured to receive light scattered by the illumination of the sample with the light at the second laser frequency, the demultiplexer further configured to receive the scattered second frequency light and to demultiplex it into a second plurality of channels, and the detector array further configured to measure the intensity of light in the second plurality of channels; and
wherein the bandwidth of each of the first and the second plurality of channels is less than the bandwidth of a scattering curve of a Raman active vibration for the material.

19. An apparatus comprising:
a laser configured to illuminate a sample of material at a first laser frequency;
a waveguide configured to receive light scattered by the illumination of the sample with the light at the first laser frequency;
a demultiplexer configured to receive the scattered first frequency light and to demultiplex it into a first plurality of channels;
a detector array configured to measure the intensity of light in the first plurality of channels;
wherein the laser is further configured to illuminate the sample of the material at a second laser frequency, the waveguide is further configured to receive light scattered by the illumination of the sample with the light at the second laser frequency, the demultiplexer further configured to receive the scattered second frequency light and to demultiplex it into a second plurality of channels, and the detector array further configured to measure the intensity of light in the second plurality of channels;

wherein the demultiplexer is a planar waveguide grating; and wherein the first and second laser frequency are the same frequency and the planar waveguide is a frequency tunable arrayed waveguide grating.

20. The apparatus of claim 19, wherein the tunable arrayed waveguide grating has a tuning range wider than its channel spacing.

21. An apparatus comprising:
a laser configured to illuminate a sample of material at a first laser frequency;
a waveguide configured to receive light scattered by the illumination of the sample with the light at the first laser frequency;
a demultiplexer configured to receive the scattered first frequency light and to demultiplex it into a first plurality of channels;
a detector array configured to measure the intensity of light in the first plurality of channels;
wherein the laser is further configured to illuminate the sample of the material at a second laser frequency, the waveguide is further configured to receive light scattered by the illumination of the sample with the light at the second laser frequency, the demultiplexer further configured to receive the scattered second frequency light and to demultiplex it into a second plurality of channels, and the detector array further configured to measure the intensity of light in the second plurality of channels;
wherein the demultiplexer is a planar waveguide grating; and
wherein the laser has a frequency tuning range suitable to re-capture missing spectral information due to the spectral characteristics of the planar waveguide grating.

22. An apparatus comprising:
a laser configured to illuminate a sample of material at a first laser frequency;
a waveguide configured to receive light scattered by the illumination of the sample with the light at the first laser frequency;
a demultiplexer configured to receive the scattered first frequency light and to demultiplex it into a first plurality of channels;
a detector array configured to measure the intensity of light in the first plurality of channels;
wherein the laser is further configured to illuminate the sample of the material at a second laser frequency, the waveguide is further configured to receive light scattered by the illumination of the sample with the light at the second laser frequency, the demultiplexer further configured to receive the scattered second frequency light and to demultiplex it into a second plurality of channels, and the detector array further configured to measure the intensity of light in the second plurality of channels;
wherein the laser is a semiconductor laser; and
wherein the semiconductor laser has an external cavity laser built on the chip with III-V gain chip as photon source and an external waveguide grating that provides feedback.

* * * * *